US011699593B2

(12) United States Patent
Nakatani et al.

(10) Patent No.: US 11,699,593 B2
(45) Date of Patent: Jul. 11, 2023

(54) METHOD OF MANUFACTURING SEMICONDUCTOR DEVICE, SUBSTRATE PROCESSING METHOD, SUBSTRATE PROCESSING APPARATUS, AND RECORDING MEDIUM

(71) Applicant: KOKUSAI ELECTRIC CORPORATION, Tokyo (JP)

(72) Inventors: Kimihiko Nakatani, Toyama (JP); Ryota Ueno, Toyama (JP); Motomu Degai, Toyama (JP); Takashi Nakagawa, Toyama (JP); Yoshitomo Hashimoto, Toyama (JP); Yoshiro Hirose, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/377,990

(22) Filed: Jul. 16, 2021

(65) Prior Publication Data

US 2022/0020598 A1    Jan. 20, 2022

(30) Foreign Application Priority Data

Jul. 16, 2020 (JP) .................................. 2020-122454

(51) Int. Cl.
  *H01L 21/311* (2006.01)
  *H01L 21/3065* (2006.01)
  *H01L 21/3213* (2006.01)

(52) U.S. Cl.
  CPC .... *H01L 21/31116* (2013.01); *H01L 21/3065* (2013.01); *H01L 21/32135* (2013.01)

(58) Field of Classification Search
  None
  See application file for complete search history.

(56) References Cited

U.S. PATENT DOCUMENTS 7,416,989 B1    8/2008  Liu et al.
2011/0059600 A1 3/2011  Sakai et al.
(Continued)

FOREIGN PATENT DOCUMENTS

JP    2011-068984 A    4/2011
JP    2016-129227 A    7/2016
(Continued)

OTHER PUBLICATIONS

Japanese Office Action dated Apr. 19, 2022 for Japanese Patent Application No. 2020-122454.
(Continued)

*Primary Examiner* — Stephanie P Duclair
(74) *Attorney, Agent, or Firm* — Volpe Koenig

(57) ABSTRACT

There is provided a technique that includes: etching a first film exposed on a surface of a substrate by performing a cycle a predetermined number of times, the cycle including non-simultaneously performing: (a) forming a first modified layer in at least a portion of a surface of the first film by supplying a first gas to the substrate; and (b) etching at least a portion of the first film with an etching species, the etching species being generated by supplying a second gas having a molecular structure different from that of the first gas to the substrate to perform at least one selected from the group of causing the second gas to react with the first modified layer and activating the first modified layer with the second gas.

20 Claims, 10 Drawing Sheets

(56) References Cited

U.S. PATENT DOCUMENTS

| | | | |
|---|---|---|---|
| 2016/0196984 A1 | 7/2016 | Lill et al. | |
| 2018/0047577 A1 | 2/2018 | Clark et al. | |
| 2018/0166255 A1* | 6/2018 | Blomberg | C09K 13/08 |
| 2019/0198345 A1* | 6/2019 | Fischer | C23F 1/00 |
| 2019/0279877 A1 | 9/2019 | Murakami et al. | |
| 2019/0348299 A1 | 11/2019 | Sakamoto et al. | |
| 2021/0151326 A1 | 5/2021 | Shimizu et al. | |

FOREIGN PATENT DOCUMENTS

| | | |
|---|---|---|
| JP | 2019-160962 A | 9/2019 |
| JP | 2020-501373 A | 1/2020 |
| KR | 10-2016-0084313 A | 7/2016 |
| KR | 10-2018-0066873 A | 6/2018 |
| KR | 10-2020-0019983 A | 2/2020 |
| SG | 10202011563 T | 6/2021 |
| WO | 2019/003663 A1 | 1/2019 |

OTHER PUBLICATIONS

Singapore Search Report dated Jul. 24, 2022 for Singapore Patent Application No. 10202107795T.
Singapore Written Opinion dated Jul. 24, 2022 for Singapore Patent Application No. 10202107795T.
Korean Office Action dated May 20, 2023 for Korean Patent Application No. 10-2021-0092742.

\* cited by examiner

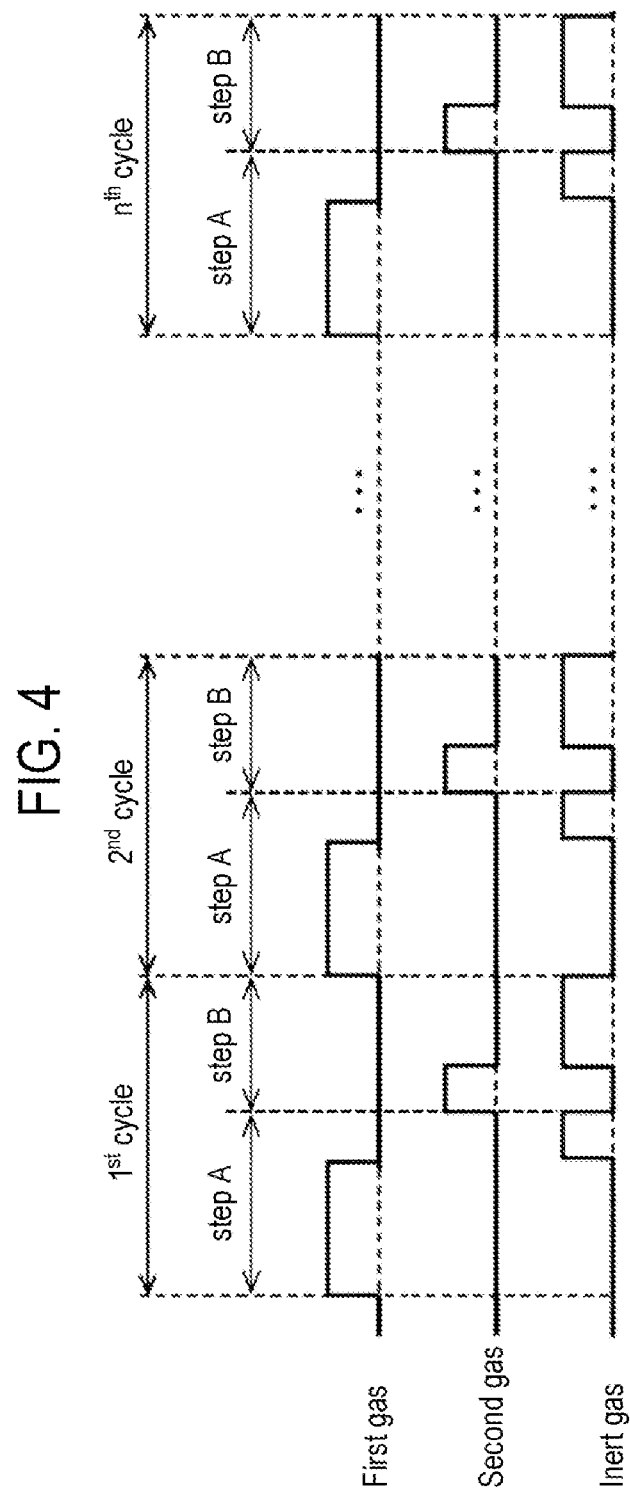

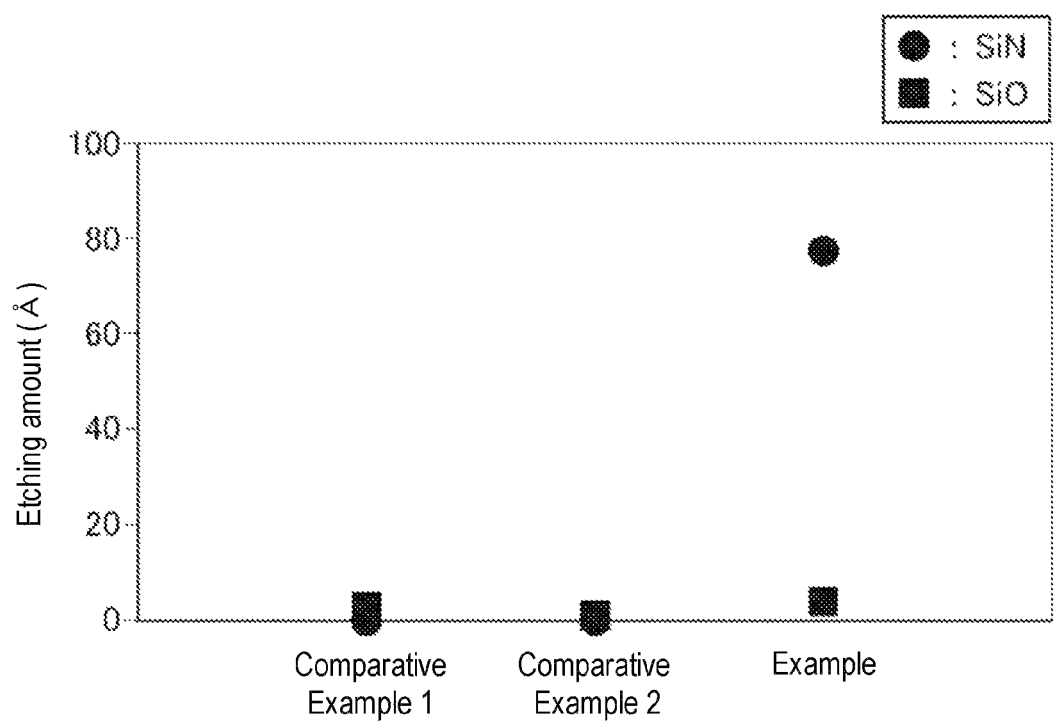

METHOD OF MANUFACTURING SEMICONDUCTOR DEVICE, SUBSTRATE PROCESSING METHOD, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2020-122454, filed on Jul. 16, 2020, the entire contents of which are incorporated herein by reference.

TECHNICAL FIELD

The present disclosure relates to a method of manufacturing a semiconductor device, a method of processing a substrate, a substrate processing apparatus, and a recording medium.

BACKGROUND

In the related art, as a process of manufacturing a semiconductor device, a process of etching a film exposed on a surface of a substrate may be carried out.

With scaling of semiconductor devices, processing dimensions are becoming finer and more complicated, and as a result, a high-precision patterning process including the above-mentioned etching process is performed many times, which causes an increase in cost. On the other hand, there is a technique of performing the above-mentioned etching process at an atomic layer level (which is hereinafter also referred to as atomic layer etching), and such a process having high controllability has attracted attention as a useful technique in reducing the number of steps. In the related art, the technique related to the atomic layer etching has mainly been a method using plasma.

In the related-art etching of a film with an etching gas, an etching amount depends on a partial pressure (≈supply amount) of the etching gas. Therefore, a pressure distribution of the gas in a reaction system causes a difference in the etching amount. For example, when etching a film formed inside a groove, even with the same process time, a film formed at the bottom of a deep groove where a gas is difficult to be supplied has an etching amount smaller than that of a film formed near an opening of the groove where the gas is easily supplied. In this manner, in the related-art etching process of the film with the etching gas, there is a need to improve a controllability of the etching amount.

SUMMARY

Some embodiments of the present disclosure provide a technique capable of enhancing a controllability of an etching amount.

According to embodiments of the present disclosure, there is provided a technique that includes: etching a first film exposed on a surface of a substrate by performing a cycle a predetermined number of times, the cycle including non-simultaneously performing: (a) forming a first modified layer in at least a portion of a surface of the first film by supplying a first gas to the substrate; and (b) etching at least a portion of the first film with an etching species, the etching species being generated by supplying a second gas having a molecular structure different from that of the first gas to the substrate to perform at least one selected from the group of causing the second gas to react with the first modified layer and activating the first modified layer with the second gas.

BRIEF DESCRIPTION OF DRAWINGS

FIG. 4 is a diagram showing a gas supply sequence of etching process in embodiments of the present disclosure.

FIG. 5J is a partially-enlarged cross-sectional view of the wafer 200 in a state where the product 30 generated on the surface of the base 200a whose surface is partially etched is desorbed from the surface of the base 200a.

FIG. 8 is a diagram showing a measurement result of an etching rate in embodiments of the present disclosure.

DETAILED DESCRIPTION

Embodiments of the Present Disclosure

Embodiments of the present disclosure will be now described with reference to FIGS. 1 to 4 and FIGS. 5A to 5K. The drawings used in the following description are schematic, and dimensional relationships, ratios, and the like of various elements on the drawings may not match actual ones. Further, the dimensional relationship, ratios, and the like of various elements between plural drawings may not match each other.

(1) Configuration of Substrate Processing Apparatus

Figure 1:
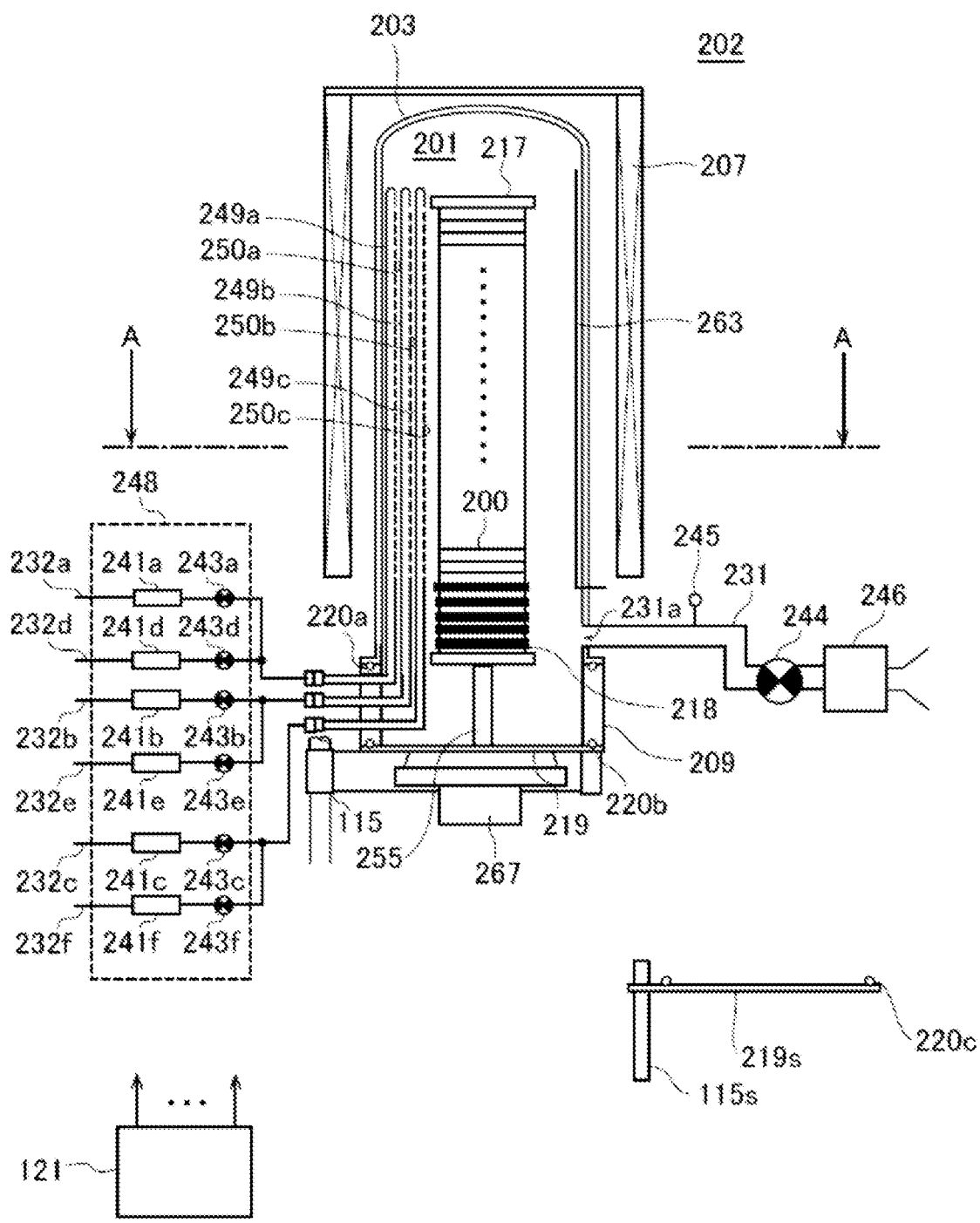
FIG. 1 is a schematic configuration view of a vertical process furnace 202 of a substrate processing apparatus suitably used in embodiments of the present disclosure, in which a portion of the process furnace 202 is shown in a vertical cross section.

As illustrated in FIG. 1, a process furnace 202 includes a heater 207 as a heating mechanism (a temperature regulator or a temperature regulation part). The heater 207 has a cylindrical shape and is supported by a holding plate to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, e.g., quartz ($SiO_2$), silicon carbide (SiC) or the like, and has a cylindrical shape with its upper end closed and its lower end opened. A manifold 209 is disposed below the reaction tube 203 in a concentric relationship with the reaction tube 203. The manifold 209 is made of a metal material such as, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A processing vessel (reaction vessel) mainly includes the reaction tube 203 and the manifold 209. A process chamber 201 is formed in a hollow cylindrical portion of the processing vessel. The process chamber 201 is configured to be capable of accommodating wafers 200 as substrates. The processing of the wafers 200 is performed in the process chamber 201.

Nozzles 249a to 249c as first to third supply parts are installed in the process chamber 201 to penetrate a sidewall of the manifold 209. The nozzles 249a to 249c will also be referred to as first to third nozzles, respectively. The nozzles 249a to 249c are each made of a heat resistant material such as quartz or SiC. Gas supply pipes 232a to 232c are respectively connected to the nozzles 249a to 249c. The nozzles 249a to 249c are different nozzles, in which each of the nozzles 249a and 249c is installed adjacent to the nozzle 249b.

Mass flow controllers (MFCs) 241a to 241c, which are flow rate controllers (flow rate control parts), and valves 243a to 243c, which are opening/closing valves, are installed in the gas supply pipes 232a to 232c sequentially from corresponding upstream sides of gas flow respectively. Gas supply pipes 232d to 232f are connected to the gas supply pipes 232a to 232c at the downstream side of the valves 243a to 243c, respectively. MFCs 241d to 241f and valves 243d to 243f are installed at the gas supply pipes 232d to 232f sequentially from corresponding upstream sides of gas flow respectively. The gas supply pipes 232a to 232f are made of, for example, a metal material such as stainless steel (SUS).

Figure 2:
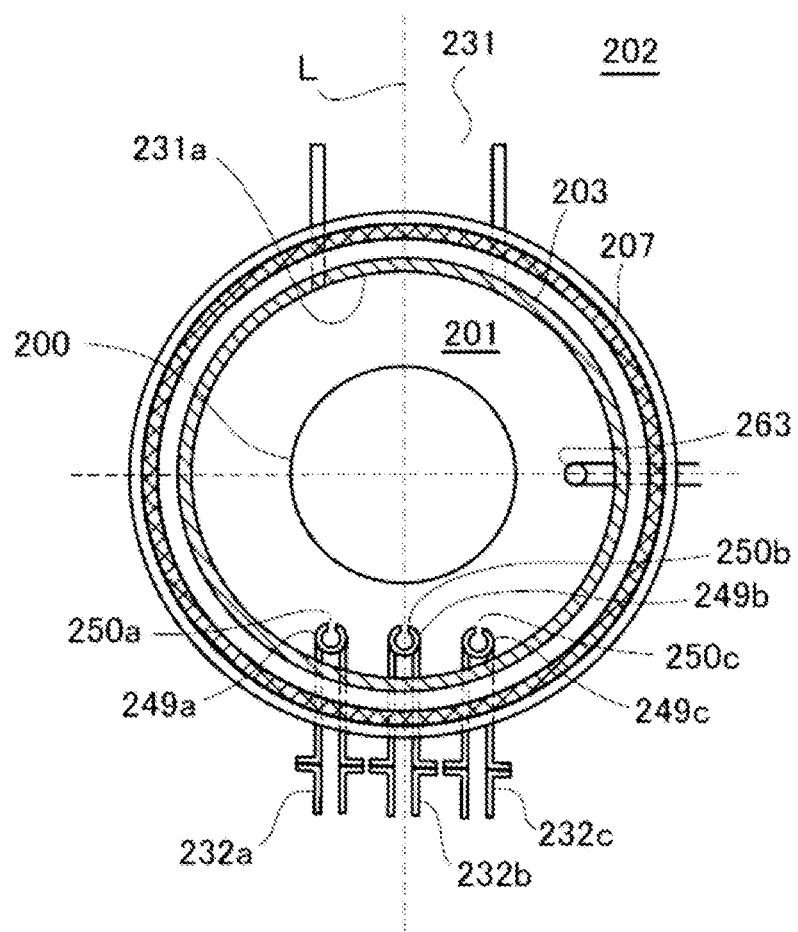
FIG. 2 is a schematic configuration view of a vertical process furnace 202 of a substrate processing apparatus suitably used in embodiments of the present disclosure, in which a portion of the process furnace 202 is shown in a cross section taken along a line A-A in FIG. 1.

As illustrated in FIG. 2, the nozzles 249a to 249c are disposed in a space with an annular plan-view shape between the inner wall of the reaction tube 203 and the wafers 200 such that the nozzles 249a to 249c extend upward along an arrangement direction of the wafers 200 from a lower portion to an upper portion of the inner wall of the reaction tube 203. Specifically, the nozzles 249a to 249c are respectively installed at a lateral side of a wafer arrangement region in which the wafers 200 are arranged, namely in a region which horizontally surrounds the wafer arrangement region, to extend along the wafer arrangement region. The nozzle 249b is disposed to face an exhaust port 231a to be described below, on a straight line in a plane view, with centers of the wafers 200 loaded into the process chamber 201 interposed therebetween. The nozzles 249a and 249c are disposed to sandwich a straight line L passing through the nozzle 249b and a center of the exhaust port 231a from both sides along the inner wall of the reaction tube 203 (an outer peripheral portion of the wafers 200). The straight line L is also a straight line passing through the nozzle 249b and the centers of the wafers 200. That is, it may be said that the nozzle 249c is installed at the opposite side of the nozzle 249a with the straight line L interposed therebetween. The nozzles 249a and 249c are disposed in line symmetry with the straight line L as a symmetry axis. Gas supply holes 250a to 250c configured to supply a gas are installed on the side surfaces of the nozzles 249a to 249c, respectively. The gas supply holes 250a to 250c are respectively opened to face the exhaust port 231a in the plane view, thus allowing a gas to be supplied toward the wafers 200. The gas supply holes 250a to 250c may be formed in a plural number between the lower portion and the upper portion of the reaction tube 203.

A first gas is supplied from the gas supply pipe 232a into the process chamber 201 via the MFC 241a, the valve 243a, and the nozzle 249a. The first gas acts as a modifier or a modifying gas.

A second gas is supplied from the gas supply pipe 232b into the process chamber 201 via the MFC 241b, the valve 243b, and the nozzle 249b. The second gas is a gas having a molecular structure different from that of the first gas. The second gas acts as an activation gas or a reaction gas.

A third gas is supplied from the gas supply pipe 232c into the process chamber 201 via the MFC 241c, the valve 243c, and the nozzle 249c. The third gas acts as a preprocessing gas.

An inert gas is supplied from the gas supply pipes 232d to 232f into the process chamber 201 via the MFCs 241d to 241f, the valves 243d to 243f, the gas supply pipes 232a to 232c, and the nozzles 249a to 249c, respectively. The inert gas acts as a purge gas, a carrier gas, a dilution gas, or the like.

A first gas supply system (a modifier supply system or a modifying gas supply system) mainly includes the gas supply pipe 232a, the MFC 241a, and the valve 243a. A second gas supply system (an activation gas supply system or a reaction gas supply system) mainly includes the gas supply pipe 232b, the MFC 241b, and the valve 243b. A third gas supply system (a preprocessing gas supply system) mainly includes the gas supply pipe 232c, the MFC 241c, and the valve 243c. An inert gas supply system mainly includes the gas supply pipes 232d to 232f, the MFCs 241d to 241f, and the valves 243d to 243f.

One or all of the aforementioned various gas supply systems may be configured as an integrated gas supply system 248 in which the valves 243a to 243f, the MFCs 241a to 241f and the like are integrated. The integrated gas supply system 248 is connected to each of the gas supply pipes 232a to 232f. In addition, the integrated gas supply system 248 is configured such that operations of supplying various gases into the gas supply pipes 232a to 232f (that is, opening/closing operations of the valves 243a to 243f, flow rate regulation operations by the MFCs 241a to 241f, and the like) are controlled by a controller 121 to be described below. The integrated gas supply system 248 is configured as an integral type or division type integrated unit, and may be attached to and detached from the gas supply pipes 232a to 232f and the like on an integrated unit basis, such that maintenance, replacement, extension, and the like of the integrated gas supply system 248 may be performed on the integrated unit basis.

The exhaust port 231a configured to exhaust an internal atmosphere of the process chamber 201 is installed at a lower side of the sidewall of the reaction tube 203. As illustrated in FIG. 2, the exhaust port 231a is installed at a position facing the nozzles 249a to 249c (the gas supply holes 250a to 250c) in the plane view, with the wafers 200 interposed therebetween. The exhaust port 231a may be installed between the lower portion and the upper portion of the sidewall of the reaction tube 203, that is, along the wafer arrangement region. An exhaust pipe 231 is connected to the exhaust port 231a.

A vacuum pump 246 as a vacuum exhaust device is connected to the exhaust pipe 231 via a pressure sensor 245 as a pressure detector (pressure detection part) configured to detect an internal pressure of the process chamber 201 and an auto pressure controller (APC) valve 244 as a pressure regulator (pressure regulation part). The APC valve 244 is configured such that a vacuum exhaust and a vacuum exhaust stop of the interior of the process chamber 201 can be performed by opening and closing the APC valve 244 while operating the vacuum pump 246 and such that the internal pressure of the process chamber 201 can be regulated by adjusting an opening degree of the APC valve 244 based on pressure information detected by the pressure sensor 245 while operating the vacuum pump 246. An exhaust system mainly includes the exhaust pipe 231, the APC valve 244, and the pressure sensor 245. The vacuum pump 246 may be included in the exhaust system.

A seal cap 219, which serves as a furnace opening lid configured to be capable of hermetically sealing a lower end opening of the manifold 209, is installed under the manifold 209. The seal cap 219 is made of a metal material such as stainless steel (SUS), and is formed in a disc shape. An O-ring 220b, which is a seal member making contact with the lower end portion of the manifold 209, is installed on an upper surface of the seal cap 219.

A rotation mechanism 267 configured to rotate a boat 217 to be described below is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by a boat elevator 115 which is an elevator mechanism installed outside the reaction tube 203. The boat elevator 115 is configured as a transfer device (transfer mechanism) which loads and unloads (transfers) the wafers 200 into and from (out of) the process chamber 201 by moving the seal cap 219 up or down.

A shutter 219s as a furnace opening lid capable of hermetically sealing the lower end opening of the manifold 209, with the boat 217 unloaded from the interior of the process chamber 201 by moving the seal cap 219 down, is installed under the manifold 209. The shutter 219s is made of a metal material such as stainless steel (SUS), and is formed in a disc shape. An O-ring 220c as a seal member making contact with the lower end portion of the manifold 209 is installed on an upper surface of the shutter 219s. An opening/closing operation (an up-down movement operation, a rotational movement operation, and the like) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is regulated such that the interior of the process chamber 201 has a desired temperature distribution. The temperature sensor 263 is installed along the inner wall of the reaction tube 203.

Figure 3:
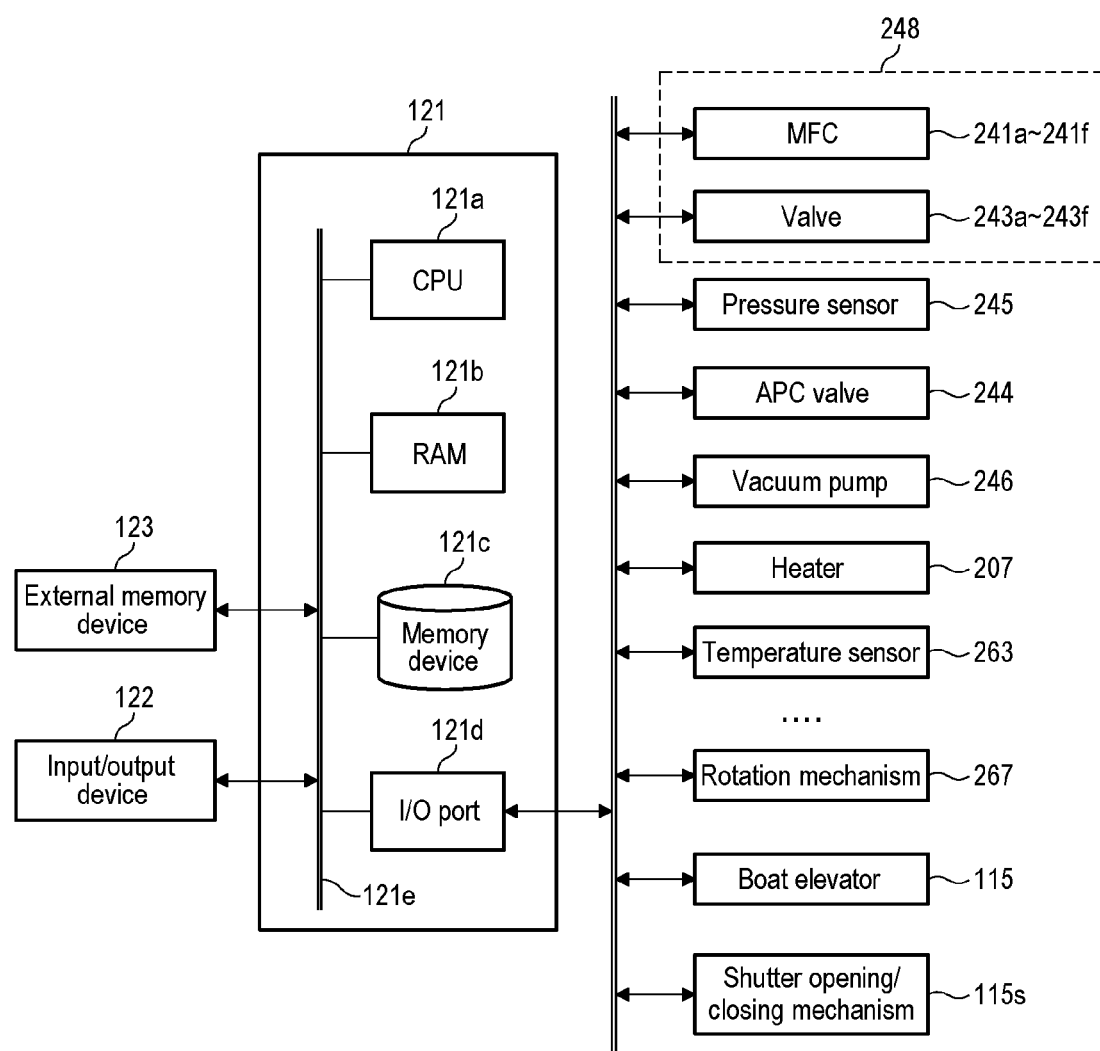
FIG. 3 is a schematic configuration diagram of a controller 121 of a substrate processing apparatus suitably used in embodiments of the present disclosure, in which a control system of a controller 121 is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to be capable of exchanging data with the CPU 121a via an internal bus 121e. An input/output device 122 configured as, for example, a touch panel or the like, is connected to the controller 121.

The memory device 121c includes, for example, a flash memory, a hard disk drive (HDD), a solid state drive (SSD), or the like. A control program that controls operations of a substrate processing apparatus, a process recipe in which sequences, conditions, and the like of substrate processing to be described below are described, and the like are readably stored in the memory device 121c. The process recipe functions as a program configured to be capable of causing the controller 121 to execute each sequence in the substrate processing to be described below, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data and the like read by the CPU 121a are temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotation mechanism 267, the boat elevator 115, the shutter opening/closing mechanism 115s, and the like.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate regulating operation of various types of gases by the MFCs 241a to 241f, the opening/closing operation of the valves 243a to 243f, the opening/closing operation of the APC valve 244, the pressure regulating operation performed by the APC valve 244 based on the pressure sensor 245, the driving and stopping of the vacuum pump 246, the temperature regulating operation performed by the heater 207 based on the temperature sensor 263, the operation of rotating the boat 217 and adjusting the rotation speed of the boat 217 with the rotation mechanism 267, the operation of moving the boat 217 up or down with the boat elevator 115, the operation of opening and closing the shutter 219s with the shutter opening/closing mechanism 115s, and the like.

The controller 121 may be configured by installing, on the computer, the aforementioned program stored in an external memory device 123. The external memory device 123 may include, for example, a magnetic disc such as a HDD, an optical disc such as a CD, a magneto-optical disc such as a MO, a semiconductor memory such as a USB memory and a SSD, and the like. The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer by using a communication means such as the Internet or a dedicated line, instead of using the external memory device 123.

(2) Substrate Processing Process

As a process of manufacturing a semiconductor device process using the above-described substrate processing apparatus, an etching process sequence example of etching a base 200a as a first film exposed on the surface of a wafer 200 as a substrate, that is, a gas supply sequence example in an etching process, will be described with reference to FIG. 4 and FIGS. 5A to 5K. In the following descriptions, operations of the respective parts constituting the substrate processing apparatus are controlled by the controller 121.

A gas supply sequence shown in FIG. 4, includes etching a base 200a, which is a first film exposed on the surface of a wafer 200, by performing a cycle a predetermined number of times (n times, where n is an integer of 1 or more), the cycle including non-simultaneously performing:

step A of forming a first modified layer 200b in at least a portion of the base 200a by supplying a first gas to the wafer 200; and step B of etching at least a portion of the base 200a with an etching species, the etching species being generated by supplying a second gas having a molecular structure different from that of the first gas to the wafer 200 to perform at least one selected from the group of causing the second gas to react with the first modified layer 200b and activating the first modified layer 200b with the second gas.

In the gas supply sequence shown in FIG. 4, each step (that is, step A and step B) is performed in a non-plasma atmosphere.

In the present disclosure, for the sake of convenience, the above-described process sequence may be denoted as follows. The same denotation may be used in modifications and the like to be described below.

(First gas→Second gas)×n

When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer formed on a wafer." When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

Further, when the term "base" is used in the present disclosure, it may refer to "a wafer itself" or "a certain layer or film formed on a surface of the wafer." When the phrase "a surface of a base" is used in the present disclosure, it may refer to "a surface of a wafer itself" or "a surface of a certain layer formed on a surface of a wafer." When the expression "a certain layer is formed on a surface of a base" is used in the present disclosure, it may mean that "a certain layer is formed directly on a surface of a wafer itself" or that "a certain layer is formed on a surface of a layer formed on a surface of a wafer."

Wafer Charging and Boat Loading

When the boat 217 is charged with a plurality of wafers 200 (wafer charging), the shutter 219s is moved by the shutter opening/closing mechanism 115s to open the lower end opening of the manifold 209 (shutter opening). Thereafter, as shown in FIG. 1, the boat 217 supporting the wafers 200 is lifted up by the boat elevator 115 and is loaded into the process chamber 201 (boat loading). In this state, the seal cap 219 seals the lower end of the manifold 209 via the O-ring 220b. In addition, the base 200a as the first film, which is a target of the etching process, is exposed on the surface of the wafer 200. The base 200a includes, for example, a silicon-based nitrogen-containing film such as a silicon nitride film (SiN film).

Pressure Regulation and Temperature Regulation

The interior of the process chamber 201, that is, a space where the wafers 200 are placed, is vacuum-evacuated (decompression-evacuated) by the vacuum pump 246 to reach a desired pressure (vacuum degree). In this operation, the internal pressure of the process chamber 201 is measured by the pressure sensor 245, and the APC valve 244 is feedback-controlled based on the measured pressure information. Further, the wafers 200 in the process chamber 201 are heated by the heater 207 to have a desired processing temperature. In this operation, a state of supplying electric power to the heater 207 is feedback-controlled based on the temperature information detected by the temperature sensor 263 such that the interior of the process chamber 201 has a desired temperature distribution. Further, rotation of the wafers 200 by the rotation mechanism 267 begins. The evacuation of the interior of the process chamber 201, and the heating and rotation of the wafers 200 are continuously performed at least until the processing on the wafers 200 is completed.

Etching Process

Then, a first cycle non-simultaneously performing the steps A and B described below is executed a predetermined number of times.

Step A

In step A, a first gas is supplied to the wafer 200, that is, to the wafer 200 with the base 200a as the first film exposed on the surface of the wafer 200 in the process chamber 201.

Specifically, the valve 243a is opened to allow the first gas to flow into the gas supply pipe 232a. A flow rate of the first gas is regulated by the MFC 241a. The first gas is supplied into the process chamber 201 via the nozzle 249a, flows over the surface of the wafer 200, and is exhausted via the exhaust port 231a. In this operation, the first gas is supplied to the wafer 200. Further, at this time, the valves 243d to 243f may be opened to allow an inert gas to be supplied into the process chamber 201 via the nozzles 249a to 249c, respectively.

Figure 5A:
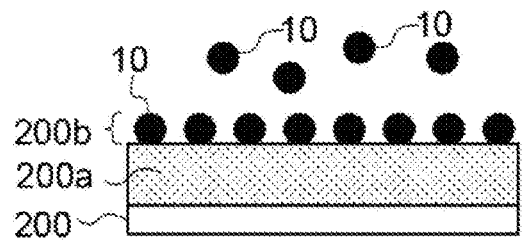
FIG. 5A is a partially-enlarged cross-sectional view of a wafer 200 with a base 200a exposed on a surface of the wafer 200 in a state where a first gas 10 is supplied to the wafer 200 and is adsorbed on the surface of the base 200a to form a first modified layer 200b.

By supplying the first gas to the wafer 200 under conditions to be described below, it is possible to modify the surface of the base 200a uniformly. Specifically, as shown in FIG. 5A, when the first gas 10 is supplied to the wafer 200 with the base 200a exposed on the surface of the wafer 200, the first gas 10 is uniformly adsorbed in the surface of the base 200a to form a first modified layer 200b.

The first modified layer 200b is formed by at least one selected from the group of causing at least a portion of molecules of the first gas 10 to be physically or chemically adsorbed on at least a portion of the surface of the base 200a (hereinafter, also referred to as modification by adsorption) and generating a compound by a chemical reaction between at least a portion of the molecules of the first gas 10 and at least a portion of atoms or molecules on the surface of the base 200a (hereinafter, also referred to as modification by compound generation). That is, in this step, it is possible to modify the surface of the base 200a by the modification by adsorption and/or the modification by compound generation by using the first gas 10. FIG. 5A shows, as an example, the first modified layer 200b formed by causing at least a portion of the molecules of the first gas 10 to be adsorbed on at least a portion of the surface of the base 200a.

In the modification by adsorption, a modified portion (that is, a portion where the first modified layer 200b is formed) of the base 200a serves as a base of an etching species to be generated in step B to be described below. Therefore, an amount of etching species to be generated in step B may be controlled by an amount of adsorption of the first gas on the surface of the base 200a. Similarly, in the modification by compound generation, a modified portion (that is, a portion where the first modified layer 200b is formed) of the base 200a serves as a base of the etching species to be generated in step B to be described below. Therefore, the amount of etching species to be generated in step B may be controlled by the amount of compound generated on the surface of the base 200a. Then, under conditions to be described below, the first modified layer 200b can be uniformly formed in the surface of the base 200a, whereby in step B to be described below, it is possible to uniformly generate the etching species in the surface of the base 200a.

Depending on process conditions, a self-limit may be generated in the reaction by which the first modified layer 200b is formed. That is, depending on the process conditions, a modification reaction by adsorption may be saturated, and a modification reaction by compound generation may also be saturated. By saturating the reaction by which the first modified layer 200b is formed, it is possible to form the first modified layer 200b more uniformly in the surface of the base 200a. As a result, in step B to be described below, it is possible to generate the etching species more uniformly in the surface of the base 200a.

After the formation of the first modified layer 200b on the surface of the base 200a is completed, the valve 243a is closed to stop the supply of the first gas into the process chamber 201. Then, the interior of the process chamber 201 is vacuum-evacuated to remove a gas and the like remaining in the process chamber 201 from the interior of the process chamber 201. At this time, the valves 243d to 243f may be opened to allow an inert gas to be supplied into the process chamber 201 via the nozzles 249a to 249c. The inert gas supplied from the nozzles 249a to 249c acts as a purge gas, whereby the interior of the process chamber 201 is purged (purge). The purge with the inert gas may not be performed. The purge removes the first gas 10 and the like that are not adsorbed on the wafer 200 while leaving the first modified layer 200b on the surface of the base 200a.

A process condition when the first gas is supplied in step A is exemplified as follows:

Processing temperature: 25 to 400 degrees C., specifically 50 to 250 degrees C.
Processing pressure: 1 to 13,300 Pa, specifically 50 to 2,660 Pa
First gas supply flow rate: 1 to 5,000 sccm, specifically 50 to 2,000 sccm
First gas supply time: 1 to 3,000 seconds, specifically 10 to 1,200 seconds
Inert gas supply flow rate (for each gas supply pipe): 100 to 5,000 sccm, specifically 100 to 3,000 sccm In the present disclosure, a notation of a numerical range such as "25 to 400 degrees C." means that a lower limit value and an upper limit value are included in the range. For example, "25 to 400 degrees C." means "25 degrees C. or higher and 400 degrees C. or lower." The same applies to other numerical ranges. Further, the processing temperature means a temperature of the wafer 200, and the processing pressure means an internal pressure of the process chamber 201. The same applies to the following description.

In the aforementioned process condition, by setting the processing temperature to 25 degrees C. or higher, specifically 50 degrees C. or higher, it is possible to form the first modified layer 200b at a practical formation rate. Further, in the aforementioned process condition, by setting the processing temperature to 400 degrees C. or lower, specifically 250 degrees C. or lower, it is possible to form the first modified layer 200b in the surface of the base 200a while suppressing the first film (base 200a) being directly etched by the first gas.

In this step, the first gas may be supplied to the wafer 200 under a condition that the reaction by which the first modified layer 200b is formed may be saturated. Thus, it possible to form the first modified layer 200b more uniformly in the surface of the base 200a. For example, by setting the processing temperature to a predetermined temperature of 250 degrees C. or lower, specifically 200 degrees C. or lower, more specifically 150 degrees C. or lower, it is possible to saturate the reaction by which the first modified layer 200b is formed. Even when the processing temperature is set to such a temperature, the reaction by which the first modified layer 200b is formed may be unsaturated by regulating conditions other than the processing temperature (for example, shortening the first gas supply time, lowering the processing pressure, and the like).

Further, the aforementioned process conditions may be conditions that when the first gas is present alone (that is, when the first gas is supplied alone to the wafer 200 having the exposed base 200a, the same applies hereinafter.), it is difficult to continue the etching reaction of the base 200a. Further, the aforementioned process conditions may be conditions that when the second gas is present alone (that is, when the second gas is supplied alone to the wafer 200 having the exposed base 200a, the same applies hereinafter.), it is difficult to continue the etching reaction of the base 200a.

A process condition when the purging with the inert gas is performed in step A is exemplified as follows:
Processing temperature: 25 to 400 degrees C., specifically 50 to 250 degrees C.
Processing pressure: 1 to 13,300 Pa, specifically 50 to 1,330 Pa
Inert gas supply flow rate (for each gas supply pipe): 100 to 5,000 sccm, specifically 500 to 3,000 sccm
Inert gas supply time: 1 to 600 seconds, specifically 10 to 120 seconds The first gas used in step A is not particularly limited as long as it is a gas capable of modifying the surface of the base 200a which is the first film.

Examples of the first gas may include a silicon (Si)-containing gas, a metal-containing gas, an oxygen (O)-containing gas, a nitrogen (N)- and hydrogen (H)-containing gas, a boron (B)-containing gas, a phosphorus (P)-containing gas, a halogen-containing gas, and the like. One or more of these gases may be used as the first gas.

An example of the Si-containing gas exemplified as an example of the first gas may include an aminosilane-based gas which is a gas containing Si and an amino group.

Here, the amino group refers to a functional group obtained by coordinating one or two hydrocarbon groups containing one or more carbon (C) atoms to one nitrogen (N) atom (a functional group obtained by substituting one or both of H's of an amino group represented by $NH_2$ with a hydrocarbon group containing one or more C atoms). When two hydrocarbon groups constituting a portion of the amino group are coordinated to one N, the two hydrocarbon groups may be the same hydrocarbon group or different hydrocarbon groups. The hydrocarbon group may contain a single bond like an alkyl group or may contain an unsaturated bond such as a double bond or a triple bond. The amino group may have a cyclic structure. Since the amino group is bonded to Si, which is the central atom of the aminosilane molecule, the amino group in aminosilane may be referred to as a ligand or an amino ligand. The aminosilane-based gas may contain Si and an amino group and may further contain a hydrocarbon group. The hydrocarbon group may contain a single bond like an alkyl group or may contain an unsaturated bond such as a double bond or a triple bond. The hydrocarbon group may have a cyclic structure. The hydrocarbon group may be bonded to Si which is the central atom of the aminosilane molecule. In this case, the hydrocarbon group in aminosilane may also be referred to as a ligand or a hydrocarbon ligand. When the hydrocarbon group is an alkyl group, this hydrocarbon group may also be referred to as an alkyl ligand. Hereinafter, the alkyl group may be represented by R.

Examples of the aminosilane-based gas may include a dimethylaminotrimethylsilane $((CH_3)_2NSi(CH_3)_3$, abbreviation: DMATMS) gas, a diethylaminotrimethylsilane $((C_2H_5)_2NSi(CH_3)_3$, abbreviation: DEATMS) gas, a diethyl aminotriethylsilane $((C_2H_5)_2NSi(C_2H_5)_3$, abbreviation: DEATES) gas, a dimethylaminotriethylsilane $((CH_3)_2NSi(C_2H_5)_3$, abbreviation: DMATES) gas, and the like. In addition, not only one amino group (a dimethylamino group or a diethylamino group) but also three alkyl groups (methyl groups or ethyl groups) are bonded to Si which is the central atom of DMATMS, DEATMS, DEATES, DMATES, and the like. That is, DMATMS, DEATMS, DEATES, DMATES, and the like contain one amino ligand and three alkyl ligands.

As the aminosilane-based gas, in addition to these, a gas of an aminosilane compound represented by the following formula [1] may be used.

$$SiA_x[(NB_2)_{(4-x)}]$$ [1]

In the chemical formula [1], "A" represents a H atom, an alkyl group, or an alkoxy group, "B" represents a H atom or an alkyl group, and "x" represents an integer of 1 to 3. The alkyl group represented by "A" may be specifically an alkyl group containing 1 to 5 carbon atoms in some embodiments, more specifically an alkyl group containing 1 to 4 carbon atoms in some embodiments. The alkyl group represented by "A" may have a straight-chain form or a branched form. Examples of the alkyl group represented by "A" may include a methyl group, an ethyl group, a n-propyl group, a n-butyl group, an isopropyl group, an isobutyl group, a sec-butyl group, a tert-butyl group, and the like. The alkoxy group represented by "A" may be specifically an alkoxy group containing 1 to 5 carbon atoms in some embodiments, more specifically an alkoxy group containing 1 to 4 carbon atoms in some embodiments. An alkyl group in the alkoxy group represented by "A" is the same as the alkyl group represented by "A." When x is 2 or 3, two or three A's may be the same or different. The alkyl group represented by "B" is the same as the alkyl group represented by "A." Further, two B's may be the same or different, and when x is 1 or 2, a plurality of $(NB_2)$ may be the same or different. Further, the two B's may be bonded to form a ring structure, and the formed ring structure may further contain a substituent such as an alkyl group.

Examples of the aminosilane-based gas represented by the formula [1] may include a monoaminosilane $(SiH_3(NR_2)$, abbreviation: MAS) gas in which in the formula [1], A is a H atom, B is an alkyl group, and x is 3 (that is, an aminosilane compound containing one amino group in one molecule), a bisaminosilane $(SiH_2(NR_2)_2$, abbreviation: BAS) gas in which in the formula [1], A is a H atom, B is an alkyl group, and x is 2 (that is, an aminosilane compound containing two amino groups in one molecule), and a trisaminosilane $(SiH(NR_2)_3$, abbreviation: TAS) gas in which in the formula [1], A is a H atom, B is an alkyl group, and x is 1 (that is, an aminosilane compound containing three amino groups in one molecule). Above all, the MAS gas may be used as the aminosilane-based gas. By using the MAS gas as the first gas, the surface of the base 200a may be modified more uniformly and sufficiently in step A.

Examples of the MAS gas may include an ethylmethylaminosilane ($SiH_3[N(CH_3)(C_2H_5)]$) gas, a dimethylaminosilane ($SiH_3[N(CH_3)_2]$) gas, a diisopropylaminosilane ($SiH_3[N(C_3H_7)_2]$) gas, a di secondarybutylaminosilane ($SiH_3[H(C_4H_9)_2]$) gas, a dimethylpiperidinosilane ($SiH_3[NC_5H_8(CH_3)_2]$) gas, a diethylpiperidinosilane ($SiH_3[NC_5H_5(C_2H_5)_2]$) gas, and the like. One or more selected from the group of these gases may be used as the MAS gas. In the present disclosure, the MAS gas may be any gas of an aminosilane compound containing one amino group in one molecule and also includes those having a structure other than the structure represented by $SiH_3(NR_2)$. For example, since the above-mentioned DMATMS, DEATMS, DEATES, and DMATES are also aminosilane compounds containing one amino group in one molecule, they may also be included in the MAS gas. The above-mentioned DMATMS, DEATMS, DEATES, and DMATES are aminosilane compounds in which in the formula [1], A is an alkyl group, B is an alkyl group, and x is 3.

An example of the Si-containing gas exemplified as an example of the first gas may include a halosilane-based gas which is a gas containing Si and a halogeno group. The halogeno group may include at least one selected from the group of a fluoro group, a chloro group, a bromo group, and an iodine group in some embodiments, and may include the chloro group among them in some embodiments. That is, the halosilane-based gas may contain at least one selected from the group of fluorine (F), chlorine (Cl), bromine (Br), and iodine (I), and may contain Cl among them in some embodiments. Examples of the halosilane-based gas may include a chlorosilane-based gas such as a hexachlorodisilane ($Si_2Cl_6$) gas, a tetrachlorosilane ($SiCl_4$) gas, a trichlorosilane ($SiHCl_3$) gas, a dichlorosilane ($SiH_2Cl_2$) gas, and a monochlorosilane ($SiH_3Cl$) gas, a fluorosilane-based gas such as a tetrafluorosilane ($SiF_4$) gas and a difluorosilane ($SiH_2F_2$) gas, a bromosilane-based gas such as a tetrabromosilane ($SiBr_4$) gas and a dibromosilane ($SiH_2Br_2$) gas, an iodosilane-based gas such as a tetraiodosilane ($SiI_4$) gas and a diiodosilane ($SiH_2I_2$) gas, and the like. One or more selected from the group of these gases may be used as the halosilane-based gas.

Further, as the halosilane-based gas, an alkylhalosilane-based gas may be used. Examples of the alkylhalosilane-based gas may include an alkylchlorosilane-based gas such as a dimethyldichlorosilane (($CH_3)_2SiCl_2$) gas and a trimethylchlorosilane (($CH_3)_3SiCl$) gas, an alkylfluorosilane-based gas such as a dimethyldifluorosilane (($CH_3)_2SiF_2$) gas and a trimethylfluorosilane (($CH_3)_3SiF$) gas, an alkylbromosilane-based gas such as a dimethyldibromosilane (($CH_3)_2SiBr_2$) gas and a trimethylbromosilane (($CH_3)_3SiBr$) gas, an alkyliodosilane-based gas such as a dimethyldiiodosilane (($CH_3)_2SiI_2$) gas and a trimethyliodosilane (($CH_3)_3SiI$) gas, and the like. One or more selected from the group of these gases may be used as the alkylhalosilane-based gas.

An example of the Si-containing gas exemplified as an example of the first gas may include a gas containing Si and H, that is, a silicon hydride gas. Examples of the silicon hydride gas may include a monosilane ($SiH_4$) gas, a disilane ($Si_2H_6$) gas, a trisilane ($Si_3H_8$) gas, a tetrasilane ($Si_4H_{10}$) gas, and the like. One or more selected from the group of these gases may be used as the silicon hydride gas.

Examples of the metal-containing gas exemplified as an example of the first gas may include a gas containing metal and an amino group, a gas containing metal and a halogeno group, and the like. The halogeno group may include at least one selected from the group of a fluoro group, a chloro group, a bromo group, and an iodine group in some embodiments, and may include the chloro group among them in some embodiments. That is, the gas containing the metal and the halogeno group may contain at least one selected from the group of F, Cl, Br, and I in some embodiments, and may contain Cl in some embodiments. Examples of the metal-containing gas may include a tetrakis(dimethylamino)titanium ($Ti[N(CH_3)_2]_4$) gas, a tetrakis(diethylamino)titanium ($Ti[N(C_2H_5)_2]_4$) gas, a tetrafluorotitanium ($TiF_4$) gas, a tetrachlorotitanium ($TiCl_4$) gas, a tetrabromotitanium ($TiBr_4$) gas, a tetraiodotitanium ($TiI_4$) gas, and the like. One or more selected from the group of these gases may be used as the metal-containing gas.

Examples of the O-containing gas exemplified as an example of the first gas may include an oxygen ($O_2$) gas, a nitric oxide (NO) gas, a nitrogen dioxide ($NO_2$) gas, a nitrous oxide ($N_2O$) gas, an ozone ($O_3$) gas, water vapor ($H_2O$ gas), a hydrogen peroxide ($H_2O_2$) gas, an $O_2$ gas+$H_2$ gas, an $O_3$ gas+$H_2$ gas, and the like. One or more selected from the group of these gases may be used as the O-containing gas.

Examples of the N- and H-containing gas exemplified as an example of the first gas may include an ammonia ($NH_3$) gas, a hydrazine ($N_2H_4$) gas, a diazene ($N_2H_2$) gas, a monomethylhydrazine ($CH_3HN_2H_2$) gas, a dimethylhydrazine (($CH_3)_2N_2(CH_3)H$) gas, a trimethylhydrazine (($CH_3)_3N_2H_2$) gas, and the like. One or more selected from the group of these gases may be used as the N- and H-containing gas.

Examples of the B-containing gas and the P-containing gas exemplified as examples of the first gas may include a B- and H-containing gas, a P- and H-containing gas, and the like. Examples of these gases may include a diborane ($B_2H_6$) gas, a phosphine ($PH_3$) gas, and the like. One or more selected from the group of these gases may be used.

Examples of the halogen-containing gas exemplified as an example of the first gas may include a C- and F-containing gas, a Cl- and F-containing gas, a F-containing gas, a N- and F-containing gas, a N-, F-, and O-containing gas, a N-, Cl-, and O-containing gas, and the like. Examples of these gases may include a tetrafluoromethane ($CF_4$) gas, a hexafluoroethane ($C_2F_6$) gas, an octafluoropropane ($C_3F_8$) gas, a chlorine monofluoride (ClF) gas, a chlorine trifluoride ($ClF_3$) gas, a fluorine ($F_2$) gas, a nitrogen trifluoride ($NF_3$) gas, a nitrosyl fluoride (FNO) gas, a nitrosyl trifluoride ($F_3NO$) gas, a nitroyl fluoride ($FNO_2$) gas, a nitrosyl chloride (ClNO) gas, a $NF_3$ gas+NO gas, a $F_2$ gas+NO gas, a ClF gas+NO gas, a $ClF_3$ gas+NO gas, and the like. One or more selected from the group of these gases may be used.

In the present disclosure, the description of two gases such as "$NF_3$ gas+NO gas" together means a mixture of $NF_3$ gas and NO gas. When supplying the mixture, the two gases may be mixed (pre-mixed) in a supply pipe and then supplied into the process chamber 201, or the two gases may be supplied separately from different supply pipes into the process chamber and then mixed (post-mixed) in the process chamber 201.

Further, in some embodiments, a gas that is difficult to store, such as the FNO gas, may be generated by mixing a $F_2$ gas and a NO gas in a supply pipe or a nozzle installed in the substrate processing apparatus, and the FNO gas generated in the supply pipe or the nozzle may be supplied into the process chamber 201. Further, for example, a gas mixing chamber may be installed in the substrate processing apparatus, the $F_2$ gas and the NO gas may be mixed in the gas mixing chamber to generate the FNO gas, and the FNO gas generated in the gas mixing chamber may be supplied into the process chamber 201 via the supply pipe or the nozzle.

Examples of the inert gas used in step A may include, in addition to the nitrogen ($N_2$) gas, a rare gas such as an argon (Ar) gas, a helium (He) gas, a neon (Ne) gas, and a xenon (Xe) gas. As the inert gas, the same gas may be used in each step to be described below.

Step B

In step B, after step A is completed, a second gas is supplied to the wafer 200 in the process chamber 201, that is, to the wafer 200 where the first modified layer 200b is formed on the surface of the base 200a. As described above, the second gas is a gas having a molecular structure different from that of the first gas.

Specifically, the valve 243b is opened to allow the second gas to flow into the gas supply pipe 232b. A flow rate of the second gas is regulated by the MFC 241b. Then, the second gas is supplied into the process chamber 201 via the nozzle 249b, flows over the surface of the wafer 200, and is exhausted via the exhaust port 231a. In this operation, the second gas is supplied to the wafer 200. Further, at this time, the valves 243d to 243f may be opened to allow an inert gas to be supplied into the process chamber 201 via the nozzles 249a to 249c, respectively.

Figure 5B:
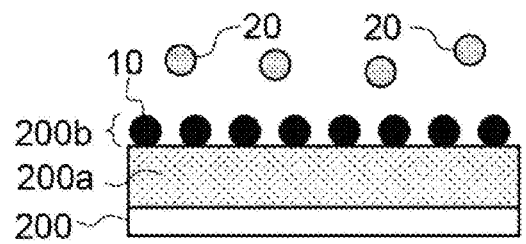
FIG. 5B is a partially-enlarged cross-sectional view of the wafer 200 in a state where a second gas 20 is supplied to the wafer 200 on which the first modified layer 200b is formed.
Figure 5C:
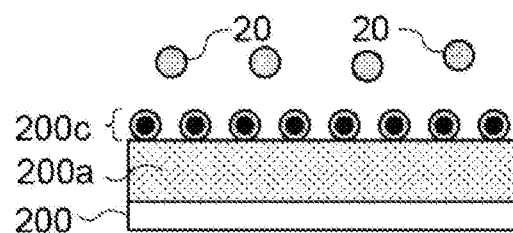
FIG. 5C is a partially-enlarged cross-sectional view of the wafer 200 in a state where the first modified layer 200b is activated by the second gas 20 and an etching species 200c is generated.

By supplying the second gas to the wafer 200 under conditions to be described below, the etching species is generated from the first modified layer 200b formed on the surface of the base 200a. Specifically, as shown in FIG. 5B, when the second gas 20 is supplied to the wafer 200 where the first modified layer 200b is formed on the surface of the base 200a, the first modified layer 200b (here, the first gas 10 adsorbed on the surface of the base 200a) is activated by the second gas 20 to generate the etching species 200c, as shown in FIG. 5C.

The etching species 200c is generated by at least one selected from the group of causing the second gas to react with the first modified layer 200b and activating the first modified layer 200b with the second gas. The generation of the etching species 200c as in the former may be referred to as generation of the etching species by reaction. The generation of the etching species 200c as in the latter may be referred to as generation of the etching species by activation. That is, in this step, the etching species 200c is generated on the surface of the base 200a by the generation of the etching species by the reaction and/or the generation of the etching species by the activation. Since the etching species 200c is generated with the first modified layer 200b formed in a layer form being as the base and exists in a layer form, the etching species 200c may be referred to as a layer 200c containing the etching species, an etching species-containing layer 200c, or simply an etching species layer 200c. FIG. 5C shows, as an example, an etching species 200c generated by activating the first gas 10 adsorbed on the surface of the base 200a with the second gas 20, that is, a layer 200c containing the etching species.

Figure 5D:
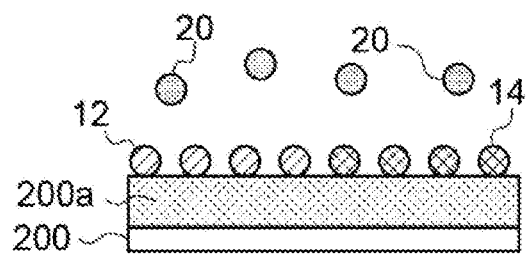
FIG. 5D is a partially-enlarged cross-sectional view of the wafer 200 in a state where a portion of the surface of the base 200a is etched by the etching species 200c to generate a first product 12 and a second product 14 at the time of etching.

When the etching species 200c is generated on the surface of the base 200a, a portion of the surface of the base 200a is etched by the etching species 200c, as shown in FIG. 5D. When the portion of the surface of the base 200a is etched by the etching species 200c, for example, a first product 12, which is a by-product, is produced in the process of the etching reaction, as shown in FIG. 5D. At this time, as a by-product, a second product 14 may be produced in addition to the first product 12. Hereinafter, a case where the first product 12 and the second product 14 are produced as by-products will be described.

Figure 5E:
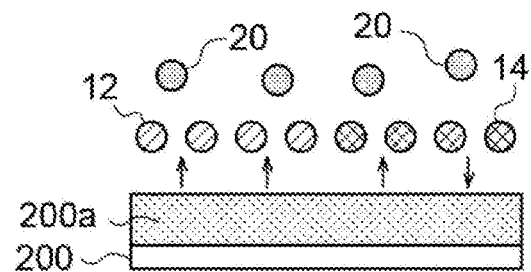
FIG. 5E is a partially-enlarged cross-sectional view of the wafer 200 showing behaviors of the first product 12 and the second product 14 on the surface of the base 200a whose surface is partially etched.
Figure 5F:
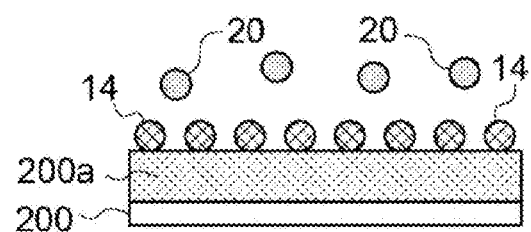
FIG. 5F is a partially-enlarged cross-sectional view of the wafer 200 in a state where the second product 14 remains and/or is adsorbed on the surface of the base 200a whose surface is partially etched.

When the portion of the surface of the base 200a is etched by the etching species 200c, and when the first product 12 and the second product 14 which are the by-products are produced, for example, the first product 12 is desorbed from the surface of the base 200a, as shown in FIG. 5E. At this time, the second product 14 remains on the surface of the base 200a. In addition, at this time, a portion of the second product 14 may be desorbed from the surface of the base 200a. Further, at this time, the second product 14 may exhibit a behavior in which desorption from the surface of the base 200a and adsorption on the surface of the base 200a are performed one or more time. FIG. 5E shows, as an example, the desorption of the second product 14 from the surface of the base 200a and the adsorption of the second product 14 on the surface of the base 200a. Then, as shown in FIG. 5F, the second product 14 is in a state where the second product 14 uniformly remains and/or is adsorbed in the surface of the base 200a whose surface is partially etched.

Figure 5G:
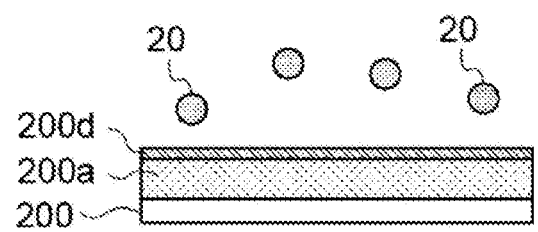
FIG. 5G is a partially-enlarged cross-sectional view of the wafer 200 in a state where at least one selected from the group of the second product 14, the second gas 20, and the base 200a whose surface is partially etched reacts to form a second modified layer 200d on the surface of the base 200a whose surface is partially etched.

In this way, when the second product 14 uniformly remains and/or is adsorbed in the surface of the base 200a whose surface is partially etched, at least one selected from the group of the second product 14, the second gas 20, and the base 200a whose surface is partially etched reacts to form a second modified layer 200d on the surface of the base 200a whose surface is partially etched, as shown in FIG. 5G. For example, the second modified layer 200d may be formed by reacting the second product 14 and the second gas 20 with the base 200a whose surface is partially etched. Further, for example, the second modified layer 200d may be formed by reacting the second product 14, the second gas 20, and the base 200a whose surface is partially etched.

In a case where the base 200a is a silicon-based nitrogen-containing film such as a SiN film and at least one selected from the group of the first gas and the second gas is the above-mentioned halogen-containing gas, the first modified layer 200b may become an adsorption layer of halogen-containing gas. In this case, as the first product 12, for example, a substance containing at least one selected from the group of nitrogen, halogen, and silicon may be produced, and as the second product 14, for example, a substance containing at least one selected from the group of nitrogen, oxygen, silicon, and halogen may be produced. Further, in this case, the second modified layer 200d may become a substance containing silicon, oxygen, and halogen.

As described above, in this step, the second product 14 may not be produced as the by-product. In this case, the second modified layer 200d may not formed on the surface of the base 200a whose surface is partially etched.

As described above, in this step, the etching species 200c is generated with the first modified layer 200b being as the base by the second gas, and a portion of the surface of the base 200a is etched by the generated etching species 200c. By undergoing such a process, it is possible to improve the controllability of the etching amount when etching the base 200a.

This is because this method is not a method of directly etching a film to be etched (here, the base 200a) with an etching gas, but is hard to be affected by a distribution of gas partial pressure (≈supply amount) due to a shape of the film to be etched.

In this method, the etching amount of the base 200a may be controlled by controlling an amount of the etching species 200c generated in step B. Further, the amount of the etching species 200c may be controlled by the adsorption amount of the first gas on the surface of the base 200a in step A and the amount of the compound generated on the surface of the base 200a in step A. That is, the amount of the etching species 200c may be controlled by an amount of the first modified layer 200b formed in step A, that is, a thickness of the first modified layer 200b, that is, a modification amount of the base 200a in step A. Then, in step A, the first modified layer 200b is uniformly formed in the surface of the base 200a, so that in step B, the etching species may be uniformly generated in the surface of the base 200a, which makes it possible to improve the uniformity of the etching amount of the base 200a. This enables a conformal etching process.

Further, as described above, in step A, a self-limit may be generated in the reaction by which the first modified layer 200b is formed. That is, in step A, the modification reaction by adsorption may be saturated, and the modification reaction by compound generation may also be saturated. By saturating the reaction by which the first modified layer 200b is formed, the first modified layer 200b may be formed more uniformly in the surface of the base 200a. As a result, in step B, the etching species may be generated more uniformly in the surface of the base 200a, so that the uniformity of the etching amount of the base 200a may be further improved. This enables a further conformal etching process. As a method of saturating this modification reaction, the method of saturating the modification reaction by adsorption can provide a controllability of the etching amount higher than that of the method of saturating the modification reaction by compound generation.

As described above, the amount of the etching species 200c generated in step B depends on the amount of the first modified layer 200b formed in step A. That is, in step B, after the generation reaction of the etching species 200c with the first modified layer 200b being as the base is completed, the etching species 200c is not generated even though the second gas is further supplied. That is, in step B, after the entire first modified layer 200b is converted into the etching species, or after a component to be converted into the etching species disappears in the first modified layer 200b, the etching species 200c is not generated even though the second gas is further increased. In this way, in this method, not only the modification reaction in step A may be saturated, but also the generation reaction of the etching species 200c in step B may be saturated. The modification reaction in step A and/or the generation reaction of the etching species 200c in step B may be made unsaturated, which makes it possible to control the etching amount more precisely and finely.

After the etching of the portion of the surface of the base 200a by the etching species 200c is completed and the second modified layer 200d is formed on the surface of the base 200a whose surface is partially etched, the valve 243b is closed to stop the supply of the second gas 20 into the process chamber 201. Then, according to the same processing sequence as the purge in step A, the interior of the process chamber 201 is vacuum-evacuated to remove a gas and the like remaining in the process chamber 201 from the interior of the process chamber 201. At this time, as in step A, the valves 243d to 243f may be opened to allow an inert gas to be supplied into the process chamber 201 via the nozzles 249a to 249c, thereby performing the purging with the inert gas. By the above purging, the second modified layer 200d is left on the surface of the base 200a whose surface is partially etched, and the second gas and the like remaining in the process chamber 201 are removed.

A process condition when the second gas is supplied in step B is exemplified as follows:
Processing temperature: 25 to 400 degrees C., specifically 50 to 250 degrees C.
Processing pressure: 1 to 13,300 Pa, specifically 50 to 2,660 Pa
Second gas supply flow rate: 1 to 5,000 sccm, specifically 50 to 2,000 sccm
Second gas supply time: 1 to 3,000 seconds, specifically 10 to 1,200 seconds
Inert gas supply flow rate (for each gas supply pipe): 100 to 5,000 sccm, specifically 100 to 3,000 sccm In the aforementioned process condition, by setting the processing temperature to 25 degrees C. or higher, specifically 50 degrees C. or higher, it is possible to generate the etching species by reaction and/or the etching species by activation. Further, in the aforementioned process condition, by setting the processing temperature to 400 degrees C. or lower, specifically 250 degrees C. or lower, the etching of the first film (the base 200a) by the etching species 200c may be promoted while suppressing the direct etching of the first film (the base 200a) by the second gas 20.

When the second gas is present alone, the aforementioned process condition may be a condition under which the etching reaction of the base 200a is difficult to continue. Further, when the first gas is present alone, the aforementioned process condition may be a condition under which the etching reaction of the base 200a is difficult to continue.

In this step, the second gas is supplied to the wafer 200 under a condition that the reaction between the second gas and the first modified layer 200b is predominantly generated (predominant) over the reaction between the second gas and the base 200a. This makes it possible to promote the generation of the etching species that contributes to the etching of the base 200a while suppressing the direct etching of the base 200a with the second gas. As a result, it is possible to further improve the controllability of the etching amount when etching the base 200a. In the aforementioned process condition, for example, by setting the processing temperature to a predetermined temperature of 400 degrees C. or lower, specifically 250 degrees C. or lower, the second gas may be supplied to the wafer 200 under the condition that the reaction between the second gas and the first modified layer 200b is predominantly generated over the reaction between the second gas and the base 200a.

Further, in this step, under the condition that the reaction between the second gas and the first modified layer 200b progresses and the reaction between the second gas and the base 200a does not progress, the second gas may be supplied to the wafer 200. This makes it possible to promote the generation of the etching species that contributes to the etching of the base 200a while reliably suppressing the direct etching of the base 200a with the second gas. As a result, it is possible to further improve the controllability of the etching amount when etching the base 200a. In the aforementioned process condition, for example, by setting the processing temperature to a predetermined temperature of 250 degrees C. or lower, specifically 200 degrees C. or lower, more specifically 150 degrees C. or lower, the second gas may be supplied to the wafer 200 under the condition that the reaction between the second gas and the first modified layer 200b progresses and the reaction between the second gas and the base 200a does not progress.

Further, in this step, the second gas is supplied to the wafer 200 under a condition that the activation of the first modified layer 200b by the second gas is predominantly generated over the activation of the base 200a by the second gas. This makes it possible to promote the generation of the etching species that contributes to the etching of the base 200a while suppressing the direct etching of the base 200a with the second gas. As a result, it is possible to further improve the controllability of the etching amount when etching the base 200a. In the aforementioned process condition, for example, by setting the processing temperature to a predetermined temperature of 400 degrees C. or lower, specifically 250 degrees C. or lower, the second gas may be supplied to the wafer 200 under the condition that the activation of the first modified layer 200b by the second gas is predominantly generated over the activation of the base 200a by the second gas.

Further, in this step, the second gas may be supplied to the wafer 200 under a condition that the activation of the first modified layer 200b by the second gas progresses and the activation of the base 200a by the second gas does not progress. This makes it possible to promote the generation of the etching species that contributes to the etching of the base 200a while reliably suppressing the direct etching of the base 200a with the second gas. As a result, it is possible to further improve the controllability of the etching amount when etching the base 200a. In the aforementioned process condition, for example, by setting the processing temperature to a predetermined temperature of 250 degrees C. or lower, specifically 200 degrees C. or lower, more specifically 150 degrees C. or lower, the second gas may be supplied to the wafer 200 under the condition that the activation of the first modified layer 200b by the second gas progresses and the activation of the base 200a by the second gas does not progress.

Further, in this step, the second gas is supplied to the wafer 200 under a condition that the etching of the base 200a by the etching species progress more than the reaction between the second gas and the base 200a. This makes it possible to suppress the direct etching of the base 200a with the second gas, such that the etching reaction of the base 200a by the etching species is generated predominantly. As a result, it is possible to further improve the controllability of the etching amount when etching the base 200a. In the aforementioned process condition, for example, by setting the processing temperature to a predetermined temperature of 400 degrees C. or lower, specifically 250 degrees C. or lower, the second gas may be supplied to the wafer 200 under the condition that the etching of the base 200a by the etching species progresses more than the reaction between the second gas and the base 200a.

Further, in the processing condition at this step, under the condition that the etching of the base 200a by the etching species progresses and the reaction between the second gas and the base 200a does not progress, the second gas may be supplied to the wafer 200. As a result, it is possible to reliably suppress the direct etching of the base 200a with the second gas, such that the etching reaction of the base 200a by the etching species is generated more predominantly. As a result, it is possible to further improve the controllability of the etching amount when etching the base 200a. In the aforementioned process condition, for example, by setting the processing temperature to a predetermined temperature of 250 degrees C. or lower, specifically 200 degrees C. or lower, more specifically 150 degrees C. or lower, under the condition that the etching of the base 200a by the etching species progresses and the reaction between the second gas and the base 200a does not progress, the second gas may be supplied to the wafer 200.

Further, as described above, in this step, under the condition that the generation reaction of the etching species 200c may be saturated, the second gas may be supplied to the wafer 200. For example, by setting the processing temperature to a predetermined temperature of 400 degrees C. or lower, specifically 250 degrees C. or lower, the generation reaction of the etching species 200c may be saturated. Further, for example, even when the processing temperature is set to a predetermined temperature of 200 degrees C. or lower or 150 degrees C. or lower, the generation reaction of the etching species 200c may be saturated. Further, as described above, in this step, after the entire first modified layer 200b is converted into the etching species, or after the component to be converted into the etching species disappears in the first modified layer 200b, since the etching species 200c is not generated, the generation reaction of the etching species 200c is relatively easy to be saturated. However, even when the processing temperature is set to such a temperature, the generation reaction of the etching species 200c may be unsaturated by regulating conditions other than the processing temperature (for example, shortening the second gas supply time, lowering the processing pressure, and the like).

A process condition under which the purging with the inert gas is performed in step B is exemplified as follows:
Processing temperature: 25 to 400 degrees C., specifically 50 to 250 degrees C.
Processing pressure: 1 to 13,300 Pa, specifically 50 to 1,330 Pa
Inert gas supply flow rate (for each gas supply pipe): 100 to 5,000 sccm, specifically 500 to 3,000 sccm
Inert gas supply time: 1 to 600 seconds, specifically 10 to 120 seconds The second gas used in step B is not particularly limited as long as it is a gas capable of reacting with the first modified layer 200b and/or activating the first modified layer 200b to generate the etching species.

Examples of the second gas may include a halogen-containing gas, an acetylacetone-based gas, and the like. Examples of the halogen-containing gas and the acetylacetone-based gas may include an I- and F-containing gas, a B- and Cl-containing gas, a Cl-containing gas, a H- and Cl-containing gas, a S-, O-, and Cl-containing gas, a H- and F-containing gas, a metal- and F-containing gas, a metal- and Cl-containing gas, a Cl- and F-containing gas, a F-containing gas, a N- and F-containing gas, a N-, F-, and O-containing gas, a N-, Cl-, and O-containing gas, a C-, H-, and O-containing gas, a C-, H-, F-, and O-containing gas, and the like.

Examples of these gases may include an iodine heptafluoride ($IF_7$) gas, an iodine pentafluoride ($IF_5$) gas, a boron trichloride ($BCl_3$) gas, a chlorine ($Cl_2$) gas, a hydrogen chloride (HCl) gas, a thionyl chloride ($SOCl_2$) gas, a hydrogen fluoride (HF) gas, a tungsten hexafluoride ($WF_6$) gas, a tungsten hexachloride ($WCl_6$) gas, a tungsten pentafluoride ($WCl_5$) gas, a chlorine monofluoride (ClF) gas, a chlorine trifluoride ($ClF_3$) Gas, a fluorine ($F_2$) gas, a nitrogen trifluoride ($NF_3$) gas, a nitrosyl fluoride (FNO) gas, a nitrosyl trifluoride ($F_3NO$) gas, a nitroyl fluoride ($FNO_2$) gas, a nitrosyl chloride (ClNO) gas, an acetylacetone ($C_5H_8O_2$) gas, a hexafluoroacetylacetone ($C_5H_2F_6O_2$) gas, and the like. One or more selected from the group of these gases can be used as the halogen-containing gas and the acetylacetone-based gas.

Further, as described above, a gas such as the FNO gas that is difficult to store may be generated by mixing a $F_2$ gas and a NO gas in a supply pipe or a nozzle installed in the substrate processing apparatus, and the FNO gas generated in the supply pipe or the nozzle may be supplied into the process chamber 201. Further, as described above, for example, a gas mixing chamber may be installed in the substrate processing apparatus, the $F_2$ gas and the NO gas may be mixed in the gas mixing chamber to generate the FNO gas, and the FNO gas generated in the gas mixing chamber may be supplied into the process chamber 201 via the supply pipe or the nozzle.

Step A in at Least One Subsequent Cycle

As described previously, in step B, the second modified layer 200d may be formed on the surface of the base 200a whose surface is partially etched. In this case, in step A in at least one subsequent cycle, the first gas is supplied to the wafer 200 in the process chamber 201, that is, the wafer 200 where the second modified layer 200d is formed on the surface of the base 200a whose surface is partially etched. A supply method and supply conditions of the first gas may be the same as those in step A described above.

Figure 5H:
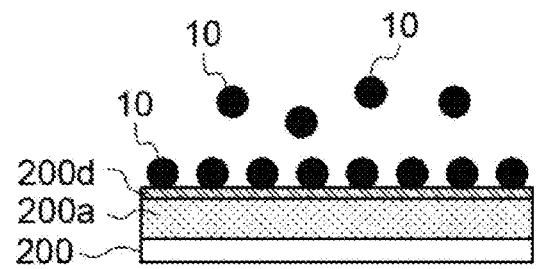
FIG. 5H is a partially-enlarged cross-sectional view of the wafer 200 in a state where the first gas 10 is supplied to the wafer 200 in which the second modified layer 200d is formed on the surface of the base 200a whose surface is partially etched and the first gas is adsorbed on the surface of the second modified layer 200d.
Figure 5I:
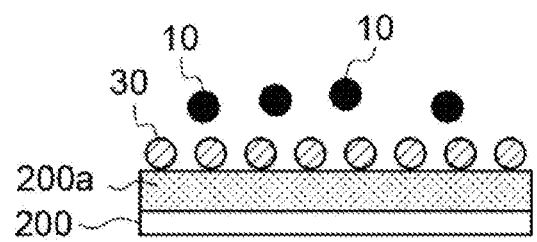
FIG. 5I is a partially-enlarged cross-sectional portion of the wafer 200 in a state where the first gas 10 reacts with the second modified layer 200d to generate a product 30 on the surface of the base 200a whose surface is partially etched.

Under the above-mentioned conditions, by supplying the first gas to the wafer 200 in which the second modified layer 200d is formed on the surface of the base 200a whose surface is partially etched, the first gas 10 is adsorbed on the surface of the second modified layer 200d, as shown in FIG. 5H. When the first gas 10 is adsorbed on the surface of the second modified layer 200d, the first gas 10 reacts with the second modified layer 200d to remove the second modified layer 200d, as shown in FIG. 5I. In the process of the reaction between the first gas 10 and the second modified layer 200d, the product 30, which is the by-product, is produced and adsorbed on the surface of the base 200a from which the second modified layer 200d has been removed. The product 30 may be, for example, the same substance as the first product 12.

Figure 5J:
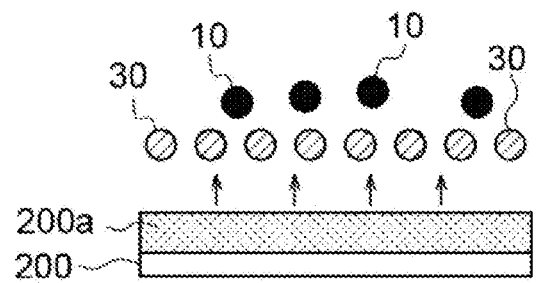
Figure 5K:
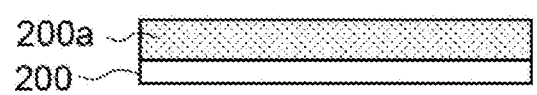
FIG. 5K is a partially-enlarged cross-sectional view of the wafer 200 in a state where the surface of the base 200a whose surface is partially etched is exposed again after the product 30 on the surface of the base 200a whose surface is partially etched is desorbed.

By continuing the supply of the first gas 10 to the wafer 200 even after the product 30 is adsorbed on the surface of the base 200a, the product 30 is desorbed from the surface of the base 200a, as shown in FIG. 5J. Then, after the product 30 is desorbed from the surface of the base 200a, the surface of the base 200a is exposed again, as shown in FIG. 5K.

Then, even after the base 200a is exposed again, by continuing the supply of the first gas 10 to the wafer 200, the first gas 10 is adsorbed on the surface of the base 200a to form a first modified layer 200b, as in the state shown in FIG. 5A. The subsequent processes are performed in the same manner as in the first cycle, and a reaction similar to that in the first cycle occurs.

In step B, in a case where the second product 14 is not produced as the by-product, the second modified layer 200d is not formed on the surface of the base 200a whose surface is partially etched. In this case, the same reaction as in step A in the first cycle occurs even in step A in the at least one subsequent cycle.

Performing Predetermined Number of Times

When a cycle that non-simultaneously (that is, asynchronously) performs the above-described steps A and B is performed a predetermined number of times (n times, where n is an integer of 1 or more), the base 200a exposed on the surface of the wafer 200 may be etched to a desired depth. The aforementioned cycle may be performed multiple times. That is, a thickness of a layer etched per one cycle may be set to be smaller than a desired thickness. Thus, the aforementioned cycle may be performed multiple times until the thickness of the layer removed by etching becomes equal to the desired thickness.

After-Purge and Returning to Atmospheric Pressure

After the etching process of the base 200a is completed, an inert gas as a purge gas is supplied into the process chamber 201 from each of the nozzles 249a to 249c and is exhausted through the exhaust port 231a. Thus, the interior of the process chamber 201 is purged to remove a gas and reaction by-products remaining in the process chamber 201 from the interior of the process chamber 201 (after-purge). Thereafter, the internal atmosphere of the process chamber 201 is substituted with an inert gas (inert gas substitution) and the internal pressure of the process chamber 201 is returned to the atmospheric pressure (returning to atmospheric pressure).

Boat Unloading and Wafer Discharging

The seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219s is moved such that the lower end opening of the manifold 209 is sealed by the shutter 219s via the O-ring 220c (shutter closing). The processed wafers 200 are unloaded to the outside of the reaction tube 203, and then are subsequently discharged from the boat 217 (wafer discharging).

(3) Effects of the Embodiments

According to the embodiments of the present disclosure, one or more effects described below may be achieved.

By performing a cycle a predetermined number of times, the cycle including non-simultaneously step A and step B, to etch the base 200a, the controllability of the etching amount of the base 200a may be improved. That is, instead of directly etching the base 200a with the first gas or the second gas, the base 200a is etched with the etching species 200c generated on the surface of the base 200a in step B. As a result, it is possible to make it less likely to be affected by the distribution of the gas partial pressure (≈supply amount) due to the shape of the base 200a, thereby improving the controllability of the etching amount of the base 200a. In this case, by controlling the amount of the etching species 200c generated on the surface of the base 200a in step B, it is possible to freely control the etching amount of the base 200a. For example, it is possible to control the etching amount of the base 200a to a level of one atomic layer (one molecular layer) or less, and it is also possible to control the etching amount of the base 200a to a level exceeding one atomic layer (one molecular layer), for example, several atomic layers (several molecular layers). The level at which the etching amount is one atomic layer (one molecular layer) or less means a level at which the etching thickness is one atomic layer (one molecular layer) or less than one atomic layer (one molecular layer). The level at which the etching amount is less than one atomic layer (one molecular layer) means a level at which the etching thickness does not reach one atomic layer (one molecular layer). For example, such a level applies to a case where the etching amount is a half-atomic layer (half-molecular layer), and the like. Further, according to this method, the etching amount may be controlled to be at a level of the half-atomic layer (half-molecular layer) or less, that is, the half-atomic layer (half-molecular layer) or less than the half-atomic layer (half-molecular layer).

Even under a situation where an amount of exposure of a gas is likely to be locally reduced or a situation where a gas partial pressure in the process chamber 201 is not constant depending on the location, for example, when a 3D structure such as a trench or a hole is formed on the surface of the wafer 200 and the base 200a is provided along the surface shape of the wafer 200, by etching the base 200a by performing a cycle a predetermined number of times, the cycle including non-simultaneously performing step A and step B, it is possible to control the etching amount of the base 200a finely so as to be uniform over the surface of the wafer 200. This enables a conformal etching process.

When at least one selected from the group of the first gas and the second gas is present alone, under the condition that the etching reaction of the base 200a is difficult to continue, the cycle including non-simultaneously performing step A and step B may be performed a predetermined number of times to realize the aforementioned effects in some embodiments. Further, when each of the first gas and the second gas is present alone, under the condition that the etching reaction of the base 200a is difficult to continue, the cycle including non-simultaneously performing step A and step B may be performed a predetermined number of times in some embodiments.

In step A, since a portion where the first modified layer 200b is formed becomes the base of the etching species 200c to be generated on the surface of the base 200a in step B, it is possible to control the amount of the etching species 200c generated in step B, that is, the etching amount, with the adsorption amount of the first gas on the surface of the base 200a in step A.

For example, in step A, by setting the thickness of the adsorption layer of the first gas (that is, the first modified layer 200b, the same applies hereinafter) formed on the surface of the base 200a to one atomic layer (one molecular layer) or less, it is possible to control the etching amount (etching thickness) of the base 200a in step B to a level of, for example, one atomic layer (one molecular layer) or less. Further, for example, in step A, by setting the thickness of the adsorption layer of the first gas formed on the surface of the base 200a to less than one atomic layer (one molecular layer), it is possible to control the etching amount of the base 200a in step B to a level of, for example, less than one atomic layer (one molecular layer). Further, for example, in step A, by setting the thickness of the adsorption layer of the first gas formed on the surface of the base 200a set to a thickness exceeding one atomic layer (one molecular layer), it is possible to control the etching amount of the base 200a in step B to a level exceeding, for example, one atomic layer (one molecular layer). Further, for example, in step A, by setting the thickness of the adsorption layer of the first gas formed on the surface of the base 200a to several atomic layers (several molecular layers), it is possible to control the etching amount of the base 200a in step B to a level of, for example, several atomic layers (several molecular layers).

Since the portion where the first modified layer 200b is formed in step A becomes the base of the etching species 200c generated on the surface of the base 200a in step B, it is possible to control the amount of the etching species 200c generated in step B, that is, the etching amount, by the amount of a compound generated on the surface of the base 200a in step A.

For example, in step A, by setting the thickness of the compound generated on the surface of the base 200a to one atomic layer (one molecular layer) or less, it is possible to control the etching amount (etching thickness) of the base 200a in step B to a level of, for example, one atomic layer (one molecular layer) or less. Further, for example, in step A, by setting the thickness of the compound generated on the surface of the base 200a to less than one atomic layer (one molecular layer), it is possible to control the etching amount of the base 200a in step B to a level of, for example, less than one atomic layer (one molecular layer). Further, for example, in step A, by setting the thickness of the compound generated on the surface of the base 200a set to a thickness exceeding one atomic layer (one molecular layer), it is possible to control the etching amount of the base 200a in step B to a level exceeding, for example, one atomic layer (one molecular layer). Further, for example, in step A, by setting the thickness of the compound generated on the surface of the base 200a to several atomic layers (several molecular layers), it is possible to control the etching amount of the base 200a in step B to a level of, for example, several atomic layers (several molecular layers).

In step A, the reaction by which the first modified layer 200b is formed, that is, the modification reaction, may be saturated. This allows the first modified layer 200b to formed more uniformly in the surface of the base 200a in step A. As a result, in step B, the etching species may be generated more uniformly in the surface of the base 200a, thereby further improving the uniformity of the etching amount of the base 200a. This enables a further conformal etching process. As a method of saturating this modification reaction, the method of saturating the modification reaction by adsorption can provide a controllability of the etching amount higher than that of the method of saturating the modification reaction by compound generation. For example, in step A, by saturating the modification reaction by adsorption, the thickness of the adsorption layer of the first gas formed on the surface of the base 200a may be easily set to one atomic layer (one molecular layer) or less.

In step B, not only the portion of the surface of the base 200a is etched, but also the second modified layer 200d that can be removed by the first gas may be formed on the surface of the base 200a whose surface has been partially etched. In this case, in step A in the at least one subsequent cycle, the second modified layer 200d is removed by supplying the first gas to the wafer 200, and the first modified layer 200b may be formed on the surface of the base 200a exposed by removing the second modified layer 200d. That is, in step A in the at least one subsequent cycle, the second modified layer 200d formed in step B may be removed, and the first modified layer 200b may be formed on the surface of the base 200a. This makes it possible to improve a total etching rate of the base 200a when the cycle including non-simultaneously performing step A and step B is performed one or more times.

The first gas may include one or more selected from the group of the above-mentioned gases exemplified as the first gas, and the second gas may include one or more selected from the group of the above-mentioned gases exemplified as the second gas. However, the first gas and the second gas need to be gases having different molecular structures. When the first gas and the second gas are in such a combination, the aforementioned effects may be particularly exhibited.

The controllability of the etching amount may be further improved by performing, under a non-plasma atmosphere, the process of etching the base 200a by performing a cycle a predetermined number of times, the cycle including non-simultaneously performing step A and step B. Further, by performing this etching process under the non-plasma atmosphere, it is possible to prevent damage to the wafer 200 and a film formed on the surface of the wafer 200 due to plasma.

Other Embodiments of the Present Disclosure

The embodiments of the present disclosure have been described above in detail. However, the present disclosure is not limited to the aforementioned embodiments, but may be differently modified without departing from the subject matter of the present disclosure.

For example, the base 200a as the first film to be etched may include at least one selected from the group of a silicon nitride film (SiN film), a silicon carbon nitride film (SiCN film), a nitrogen-rich silicon oxynitride film (SiON film), a nitrogen-rich silicon oxycarbonitride film (SiOCN film), a silicon boron nitride film (SiBN film), a silicon borocarbonitride film (SiBCN film), a boron nitride film (BN film), a titanium nitride film (TiN film), a tungsten nitride film (WN film), a tungsten film (W film), a molybdenum film (Mo film), a silicon film (Si film), a germanium film (Ge film), and a silicon germanium film (SiGe film).

Further, the O-containing film such as the SiON film or the SiOCN film as the first film may be a N-rich film, that is, a film having a higher N concentration in the film than an O concentration in the film in some embodiments. That is, the SiON film and the SiOCN film may be a N-rich SiON film and a N-rich SiOCN film, respectively, in some embodiments. Even in a case where the first film contains O in addition to N, when the N concentration is higher than the O concentration, the first film may be sufficiently etched with the method according to the aforementioned embodiments.

In this way, the base 200a as the first film may be a nitrogen-containing film such as a silicon-based nitride film (silicon-based nitrogen-containing film) such as a SiN film, a SiCN film, a N-rich SiON film, a N-rich SiOCN film, a SiBN film, or a SiBCN film, a boron-based nitride film (boron-based nitrogen-containing film) such as a BN film, or a metal-based nitride film (metal-based nitrogen-containing film) such as a TiN film or a WN film, a metal film (transition metal film or transition metal single film) such as a W film or a Mo film, or a semiconductor film such as a Si film, a Ge film, or a SiGe film.

Even when the base 200a as the first film is at least one selected from the group of these films, the same effects as those in the above-described embodiment may be achieved.

Further, for example, as in a processing sequence described below, a pre-process (step C) of supplying a third gas to the wafer 200 may be performed before the first gas is supplied to the wafer 200. This makes it possible to promote the formation of the first modified layer 200b on the surface of the base 200a exposed on the surface of the wafer 200, for example.

(Third gas→First gas→Second gas)×n

Hereinafter, a processing sequence and a process condition in step C will be described. Processing sequences and processing conditions other than those in step C may be the same as those described above.

Step C

In step C, the third gas is supplied to the wafer 200 in the process chamber 201, that is, to the wafer 200 having a surface on which the base 200a as the first film is exposed.

Specifically, the valve 243c is opened to allow the third gas to flow into the gas supply pipe 232c. A flow rate of the third gas is regulated by the MFC 241c, and then the third gas is supplied into the process chamber 201 via the nozzle 249c, flows over the surface of the wafer 200, and is exhausted via the exhaust port 231a. In this operation, the third gas is supplied to the wafer 200. Further, at this time, the valves 243d to 243f may be opened to allow the inert gas to be supplied into the process chamber 201 via the nozzles 249a to 249c, respectively.

By supplying the third gas to the wafer 200 under conditions to be described below, it is possible to pre-process the surface of the base 200a exposed on the surface of the wafer 200. For example, the surface of the base 200a may be pre-processed so that the surface of the base 200a functions as an adsorption site of the first gas.

After pre-processing the surface of the base 200a, the valve 243c is closed to stop the supply of the third gas into the process chamber 201. Then, the interior of the process chamber 201 is vacuum-evacuated to remove a gas or the like remaining in the process chamber 201 from the interior of the process chamber 201. At this time, the valves 243d to 243f are opened to allow an inert gas to be supplied into the process chamber 201 via the nozzles 249a to 249c. The inert gas supplied from the nozzles 249a to 249c acts as a purge gas, whereby the interior of the process chamber 201 is purged (purge). The purging with the inert gas may not be performed.

A process condition when the third gas is supplied in step C is exemplified as follows:
Processing temperature: 30 to 300 degrees C.
Processing pressure: 5 to 1,000 Pa
Third gas supply flow rate: 10 to 2,000 sccm
Third gas supply time: 5 to 1,800 seconds
Inert gas supply flow rate (for each gas supply pipe): 0 to 10,000 sccm The third gas is not particularly limited as long as it is a gas capable of performing the aforementioned pre-process, that is, a gas capable of forming an adsorption site of the first gas on the surface of the base 200a.

An example of the third gas may include an O- and H-containing gas. Examples of the O- and H-containing gas may include a $H_2O$ gas, a $H_2O_2$ gas, and the like. Further, Examples of the O- and H-containing gas may include an O-containing gas and a H-containing gas such as an $O_2$ gas+$H_2$ gas. When these gases are used as the third gas, the surface of the base 200a is terminated with a hydroxyl group (OH) in step C. That is, in this case, an OH termination is formed as an adsorption site on the surface of the base 200a. When the OH termination is formed as the adsorption site on the surface of the base 200a, a gas, such as the aforementioned aminosilane-based gas or the like, that reacts with the OH termination may be used as the first gas in some embodiments.

Further, an example of the third gas may include a N- and H-containing gas. Examples of the N- and H-containing gas may include a $NH_3$ gas, a $N_2H_4$ gas, a $N_2H_2$ gas, and the like. When these gases are used as the third gas, the surface of the base 200a is terminated with a NH group in step C. That is, in this case, a NH termination is formed as an adsorption site on the surface of the base 200a. When the NH termination is formed as the adsorption site on the surface of the base 200a, a gas, such as the aforementioned halosilane-based gas or alkylhalosilane-based gas, that reacts with the NH termination may be used as the first gas in some embodiments. In this case, the aforementioned chlorosilane-based gas or alkylchlorosilane-based gas may be used as the halosilane-based gas or alkylhalosilane-based gas in some embodiments.

Further, as the third gas, for example, a N- and H-containing gas or a N-containing gas may be plasma-excited and used. For example, as the third gas, an $NH_3$ gas, a $N_2H_4$ gas, a $N_2H_2$ gas, a $N_2$ gas, and the like may be plasma-excited and used. When the N- and H-containing gas is plasma-excited and used as the third gas, a gas containing active species (for example, radicals) such as $NH_3^*$, $NH_2^*$, and $NH^*$ is supplied to the surface of the base 200a. In this case, in step C, the surface of the base 200a is terminated with a NH group, and a NH termination is formed as an adsorption site on the surface of the base 200a. When the N-containing gas is plasma-excited and used as the third gas, a gas containing active species (for example, radicals) such as $N_2^*$ and $N^*$ is supplied to the surface of the base 200a. In this case, in step C, the surface of the base 200a is terminated with N, and a N termination is formed as an adsorption site on the surface of the base 200a. When the NH termination is formed as the adsorption site on the surface of the base 200a, a gas, such as the aforementioned halosilane-base gas or alkylhalosilane-based gas, that reacts with the NH termination may be used as the first gas in some embodiments. In this case, the aforementioned chlorosilane-based gas or alkylchlorosilane-based gas may be used as the halosilane-based gas or alkylhalosilane-based gas in some embodiments. When the N termination is formed as the adsorption site on the surface of the base 200a, a gas, such as the aforementioned aminosilane-based gas, that reacts with the N termination may be used as the first gas.

According to these embodiments, the same effects as those in the aforementioned embodiments may be achieved. Further, according to these embodiments, the adsorption of the first gas on the surface of the base 200a may be promoted, which makes it possible to shorten the processing time in step A. Further, in step A, the adsorption layer of the first gas may be more uniformly formed in the surface of the base 200a, and further, a density of the adsorption layer of the first gas formed on the surface of the base 200a may be increased, which makes it possible to generate the etching species more uniformly in the surface of the base 200a in step B. This enables a further conformal etching process.

These embodiments are particularly effective when the modification reaction by adsorption is generated in step A.

Figure 9A:
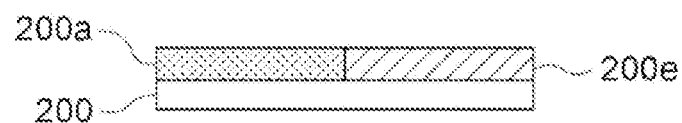
FIG. 9A is a partially-enlarged cross-sectional view of a wafer 200 with a base 200a and a base 200e exposed on the surface of the wafer 200 in a state before an etching process is performed on the wafer 200.

Further, for example, as shown in FIG. 9A, the cycle including non-simultaneously performing step A and step B may be performed a predetermined number of times on the wafer 200 having a surface on which a base 200e as a second film made of material different from that of the base 200a, in addition to the base 200a as a first film, is exposed. The base 200a as the first film includes, for example, a silicon-based nitrogen-containing film such as a silicon nitride film (SiN film). Further, the base 200e as the second film includes, for example, a silicon-based oxygen-containing film such as a silicon oxide film (SiO film).

These embodiments are different from the aforementioned embodiments in that the wafer 200 having the surface on which the base 200a and the base 200e are exposed is used, and the etching process in these embodiments may be performed in the same manner as the etching processes in the aforementioned embodiments. That is, a processing sequence and a processing condition of the etching process in these embodiments may be the same as those of the etching process in the aforementioned embodiments.

Figure 9B:
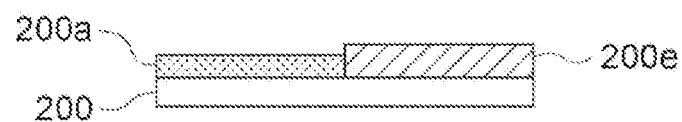
FIG. 9B is a partially-enlarged cross-sectional view of the wafer 200 in a state during etching process when the etching process is performed on the wafer 200 with the base 200a and the base 200e exposed on the surface of the wafer 200.
Figure 9C:
FIG. 9C is a partially-enlarged cross-sectional view of the wafer 200 in a state after the etching process is performed on the wafer 200 with the base 200a and the base 200e exposed on the surface of the wafer 200.

By performing the cycle a predetermined number of times, the cycle including non-simultaneously performing step A and step B, on the wafer 200 having a surface on which the base 200a and the base 200e are exposed, it is possible to selectively etch the base 200a with respect to the base 200e, as shown in FIGS. 9B and 9C. That is, by performing the cycle a predetermined number of times, the cycle including non-simultaneously performing step A and step B, on the wafer 200 having the surface on which the base 200a and the base 200e are exposed, it is possible to promote the etching of the base 200a while suppressing the etching of the base 200e. It is considered that this is because in the etching process in the aforementioned embodiments, the aforementioned various kinds of reactions are generated on the surface of the base 200a while the aforementioned various kinds of reactions are unlikely to be generated on the surface of the base 200e. FIG. 9B shows a state of the surface of the wafer 200 during the etching process, and FIG. 9C shows a state of the surface of the wafer 200 after the etching process is completed.

According to these embodiments, the base 200a may be etched with respect to the base 200e with a selectivity of 5:1 or more, a selectivity of 10:1 or more, or a selectivity of 20:1 or more. Further, according to these embodiments, the base 200a may be etched with respect to the base 200e with a selectivity of 30:1 or more, a selectivity of 40:1 or more, a selectivity of 50:1 or more, and furthermore with more selectivity. Further, according to these embodiments, depending on conditions, the base 200a can be etched without substantially etching the base 200e. In the present disclosure, "etching the base 200a with respect to the base 200e with a selectivity of 5:1 or more" means that the etching amount of the base 200a is "5" or more when the etching amount of the base 200e is "1."

In this way, according to these embodiments, it is possible to promote the etching of the base 200a while suppressing the etching of the base 200e, which makes it possible to etch the base 200a with respect to the base 200e with high selectivity. That is, according to these embodiments, a so-called selective etching in which a specific film is selectively etched is possible. Further, according to these embodiments, it is possible to improve the controllability of the etching amount in the selective etching.

In these embodiments, the base 200a may include a nitride film and the base 200e may include a film (for example, an oxide film) other than the nitride film in some embodiments. In some embodiments, the base 200a may include a silicon nitride film and the base 200e may include a film (for example, a silicon oxide film) other than the silicon nitride film. Further, in some embodiments, the base 200a may include a nitrogen-containing film and the base 200e may include a film (for example, an oxygen-containing film) other than the nitrogen-containing film. Further, in some embodiments, the base 200a may include a silicon- and nitrogen-containing film and the base 200e may include a film (for example, a silicon- and oxygen-containing film) other than the silicon- and nitrogen-containing film. When the base 200a and the base 200e are in such a combination, the aforementioned effects may be particularly exhibited. However, the base 200a may be a film other than the nitride film (silicon nitride film, nitrogen-containing film, and silicon- and nitrogen-containing film). Further, the base 200e may be a film other than the oxide film (silicon oxide film, oxygen-containing film, and silicon- and oxygen-containing film).

For example, as in the aforementioned embodiments, the base 200a as the first film may be at least one selected from the group of a SiN film, a SiCN film, a N-rich SiON film, a N-rich SiOCN film, a SiBN film, a SiBCN film, a BN film, a TiN film, a WN film, a W film, a Mo film, a Si film, a Ge film, and a SiGe film. Further, as in the aforementioned embodiments, the O-containing film such as the SiON film or the SiOCN film as the first film may be a N-rich film, that is, a film having a higher N concentration in the film than an O concentration in the film. In this way, the base 200a as the first film may be a nitrogen-containing film such as a silicon-based nitride film (silicon-based nitrogen-containing film) such as a SiN film, a SiCN film, a N-rich SiON film, a N-rich SiOCN film, a SiBN film, or a SiBCN film, a boron-based nitride film (boron-based nitrogen-containing film) such as a BN film, or a metal-based nitride film (metal-based nitrogen-containing film) such as a TiN film or a WN film, a metal film (transition metal film or transition metal single film) such as a W film or a Mo film, or a semiconductor film such as a Si film, a Ge film, or a SiGe film.

The base 200e as the second film may be at least one selected from the group of a silicon oxide film (SiO film), a silicon oxycarbide film (SiOC film), an oxygen-rich silicon oxynitride film (SiON film), an oxygen-rich silicon oxycarbonitride film (SiOCN film), a titanium oxide film (TIO film), a hafnium oxide film (HfO film), a zirconium oxide film (ZrO film), an aluminum oxide film (AlO film), and an aluminum film (Al film).

Further, in some embodiments, the O-containing film such as the SiON film or the SiOCN film as the second film may be an O-rich film, that is, a film having a higher O concentration in the film than a N concentration in the film. That is, in some embodiments, the SiON film and the SiOCN film may be an O-rich SiON film and an O-rich SiOCN film, respectively. Even in a case where the second film contains N in addition to O, when the O concentration is higher than the N concentration, it is possible to suppress the etching of the second film with the method of the aforementioned embodiments.

In this way, the base 200e as the second film may be an oxygen-containing film such as a silicon-based oxide film (silicon-based oxygen-containing film) such as a SiO film, a SiOC film, an O-rich SiON film, or an O-rich SiOCN film, or a metal-based oxide film (metal-based oxygen-containing film) such as a TiO film, a HfO film, a ZrO film, or an AlO film, or a metal film (non-transition metal film or non-transition metal single film) such as an Al film.

Further, for example, a plurality of films such as a second film (the base 200e) and a third film, in addition to the first film (the base 200a), may be exposed on the surface of the wafer 200. The films (specifically, the first film, the second film, the third film, and the like) exposed on the surface of the wafer 200 may be the film exemplified as the first film or the film exemplified as the second film.

For example, a SiN film, a SiO film, and a Si film may be exposed as the first film, the second film, and the third film, respectively, on the surface of the wafer 200. In this case, the SiN film and the Si film may be selectively etched with respect to the SiO film. Further, for example, a SiCN film, a SiOC film, and an AlO film may be exposed as the first film, the second film, and the third film, respectively, on the surface of the wafer 200. In this case, the SiCN film may be selectively etched with respect to the SiOC film and the AlO film. Further, for example, a N-rich SiOCN film, an O-rich SiOCN film, a N-rich SiON film, and an O-rich SiON film may be exposed as the first film, the second film, the third film, and a fourth film, respectively, on the surface of the wafer 200. In this case, it is possible to selectively etch the N-rich SiOCN film and the N-rich SiON film with respect to the O-rich SiOCN film and the O-rich SiON film. In these cases, the same effects as those in the aforementioned embodiments may be achieved.

Recipes used in each process may be provided individually according to the processing contents and may be stored in the memory device 121c via a telecommunication line or the external memory device 123. Moreover, at the beginning of each process, the CPU 121a may properly select an appropriate recipe from a plurality of recipes stored in the memory device 121c according to the processing contents. Thus, it is possible for a single substrate processing apparatus to realize various types of etching processes with enhanced reproducibility. Further, it is possible to reduce an operator's burden and to quickly start each process while avoiding an operation error.

The aforementioned recipes are not limited to newly-provided ones but may be provided, for example, by modifying the existing recipes that are already installed in the substrate processing apparatus. When the recipes are modified, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

In the aforementioned embodiments, there have been described examples in which an etching process is performed by using a batch-type substrate processing apparatus capable of processing a plurality of substrates at a time. The present disclosure is not limited to the aforementioned embodiments, but may be suitably applied, for example, to a case where an etching process is performed by using a single-wafer-type substrate processing apparatus capable of processing a single substrate or several substrates at a time. Further, in the aforementioned embodiments, there has been described examples in which an etching process is performed by using a substrate processing apparatus including a hot-wall-type process furnace. The present disclosure is not limited to the aforementioned embodiments, but may be appropriately applied to a case where an etching process is performed by using a substrate processing apparatus including a cold-wall-type process furnace.

Even in the case of using these substrate processing apparatuses, each process may be performed with processing sequences and processing conditions similar to those of the aforementioned embodiments to achieve effects similar to those of the aforementioned embodiments.

The aforementioned embodiments may be appropriately combined with one another. The processing sequences and process conditions used in this case may be similar to, for example, the processing sequences and process conditions of the aforementioned embodiments.

EXAMPLES

Comparative Example 1

Bu using the aforementioned substrate processing apparatus, the first gas is used alone to perform an etching process on a SiN film and a SiO film exposed on a surface of a wafer, and etching amounts of the films are measured. As the first gas, one selected from the group of the fluorine-based gases exemplified as the first gas in the aforementioned embodiments is used. A process condition is set to a predetermined condition within a range of the process condition in the aforementioned step A, except that a processing temperature is set to 100 degrees C., 250 degrees C., 350 degrees C., or 400 degrees C.

Figure 6:
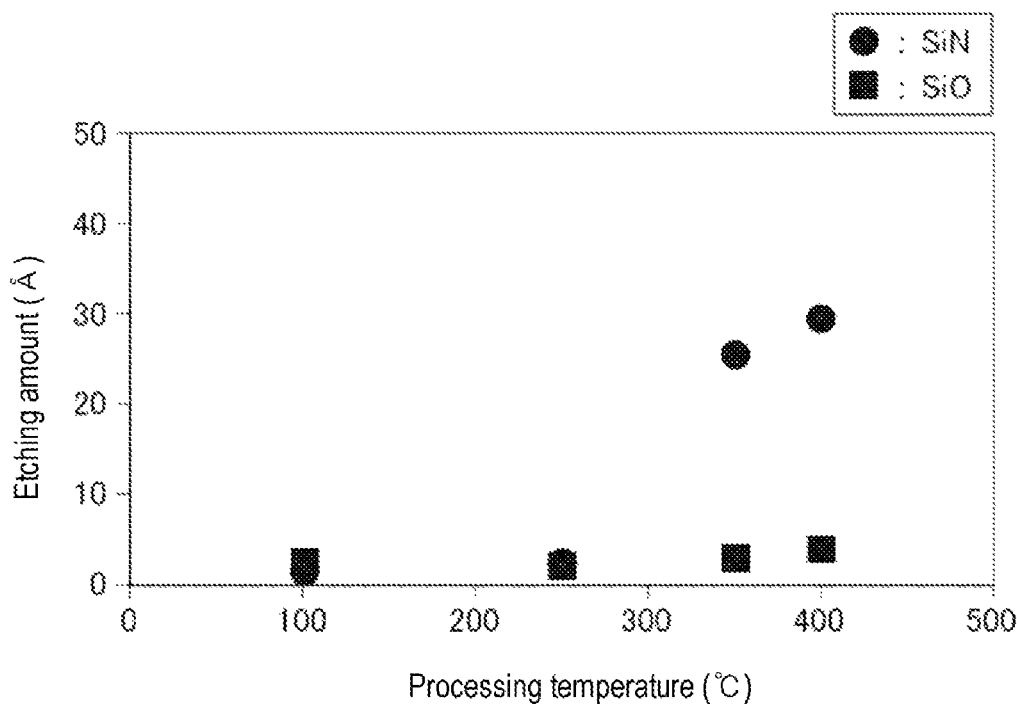
FIG. 6 is a diagram showing a measurement result of an etching rate in a first comparative example.

FIG. 6 shows a measurement result of the etching amount in Comparative Example 1. The horizontal axis in FIG. 6 represents the processing temperature (degrees C.), and the vertical axis in FIG. 6 represents the etching amounts (Å) of the SiN film and the SiO film respectively. Further, in FIG. 6, a mark ■ indicates the measurement result of the etching amount of the SiO film, and a mark ● indicates the measurement result of the etching amount of the SiN film.

From FIG. 6, it can be seen that in the case of a process with the first gas alone, none of the SiN film and the SiO film are etched when the processing temperature is 100 to 250 degrees C. On the other hand, when the processing temperature exceeds 250 degrees C., it can be seen that even when the process is performed with the first gas alone, the SiN film is etched and the SiO film is slightly etched.

Comparative Example 2

By using the aforementioned substrate processing apparatus, the second gas is used alone to perform an etching process on a SiN film and a SiO film exposed on the surface of a wafer, and etching amounts of the films are measured. As the second gas, a gas having a molecular structure different from that of the first gas in Comparative Example 1, which is one selected from the group of the fluorine-based gases exemplified as the second gas in the aforementioned embodiments, was used. A process condition is set to a predetermined condition within a range of the process condition in the aforementioned step B, except that the processing temperature is set to 35 degrees C. or 100 degrees C.

Figure 7:
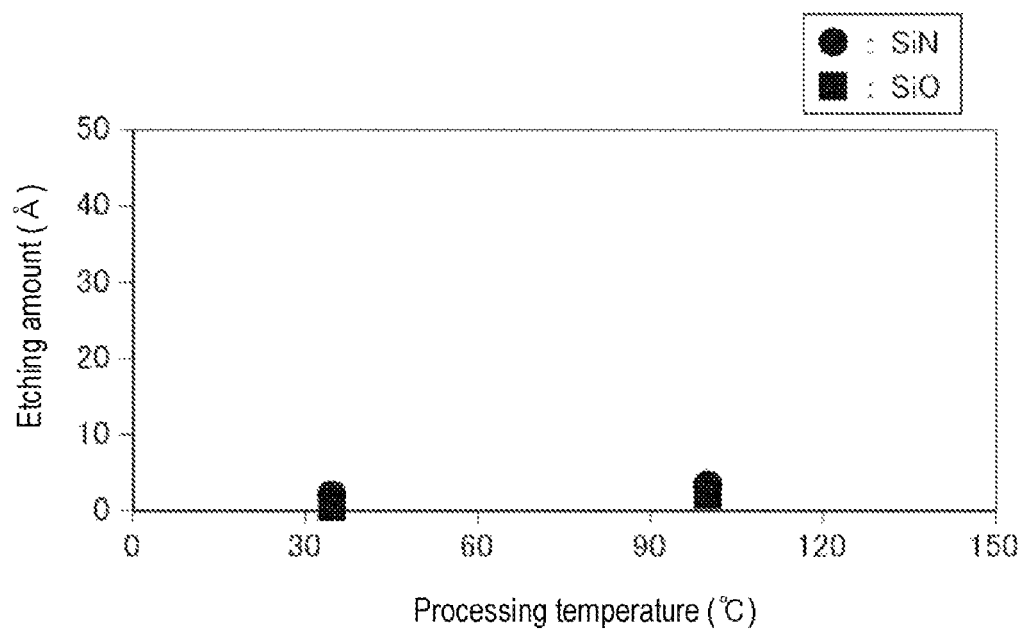
FIG. 7 is a diagram showing the measurement result of an etching rate in a second comparative example.

FIG. 7 shows the measurement result of the etching amount in Comparative Example 2. The horizontal axis in FIG. 7 represents the processing temperature (degrees C.), and the vertical axis in FIG. 7 represents the etching amount (A) of the SiN film and the SiO film respectively. Further, in FIG. 7, a mark ■ indicates the measurement result of the etching amount of the SiO film, and a mark ● indicates the measurement result of the etching amount of the SiN film.

From FIG. 7, it can be seen that in the case of a process with the second gas alone, none of the SiN film and the SiO film are etched when the processing temperature is 35 to 100 degrees C. Further, in the case of the process with the second gas alone, it is confirmed that when the processing temperature is 100 to 250 degrees C., there is a tendency that none of the SiN film and the SiO film are etched. Further, even in the case of the process with the second gas alone, it is confirmed that when the processing temperature exceeds 250 degrees C., there is a tendency that both the SiN film and the SiO film are slightly etched. Further, even in the case of the process with the second gas alone, it is confirmed that when the processing temperature is 400 degrees C. or higher, there is a tendency that both the SiN film and the SiO film are etched.

EXAMPLES

Using the aforementioned substrate processing apparatus, according to the processing sequence shown in FIG. 4, an etching process is performed on a SiN film and a SiO film exposed on the surface of a wafer, and etching amounts of the films are measured. As the first gas, the same gas as the first gas in Comparative Example 1 is used, and as the second gas, the same gas as the second gas in Comparative Example 2 is used. The process condition is set to a predetermined condition within a range of the process conditions in the aforementioned step A and step B, except that the processing temperature is set to 100 degrees C.

FIG. 8 shows the measurement result of the etching amount in Example. For comparison, the etching amounts when the processing temperatures in Comparative Example 1 and Comparative Example 2 are 100 degrees C. are also shown in FIG. 8. The vertical axis in FIG. 8 represents the etching amounts (A) of the SiN film and the SiO film. In FIG. 8, a mark ■ indicates the measurement result of the SiO film, and a mark ● indicates the measurement result the SiN film.

As shown in FIG. 8, at the processing temperature of 100 degrees C., even in the case of a process with the first gas alone (Comparative Example 1) and even in the case of a process with the second gas alone (Comparative Example 2), it can be seen that none of the SiN film and the SiO film are etched. On the other hand, in Example, by performing the etching process according to the processing sequence shown in FIG. 4 at the processing temperature of 100 degrees C., it can be seen that the SiO film is hardly etched, but the etching amount of the SiN film is close to 80 Å. Further, in Example shown in FIG. 8, it can be seen that the SiN film can be etched with respect to the SiO film with a selectivity of 35:1 to 45:1.

Such a difference in the etching amount, that is, a difference between the etching amount of the SiO film in Comparative Example 1, Comparative Example 2, and Example and the etching amount of the SiN film in Example, has a similar tendency at least within a range of the processing temperature of 25 to 250 degrees C. Further, such a difference in the etching amount has a similar tendency even within a range of 250 to 400 degrees C. Therefore, when the etching process is performed according to the processing sequence shown in FIG. 4, the processing temperature may be specifically in the range of 25 to 400 degrees C., or more specifically in the range of 25 to 250 degrees C.

According to the present disclosure in some embodiments, it is possible to provide a technique of enhancing a controllability of an etching amount.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
 etching a first film exposed on a surface of the substrate by performing a cycle two or more times, the cycle including non-simultaneously performing:
 (a) forming a first modified layer in at least a portion of a surface of the first film by supplying a first gas to the substrate; and
 (b) etching at least a portion of the first film with an etching species and forming a second modified layer, which is removable by the first gas, in at least a portion of the surface of the first film having at least the portion etched, by supplying a second gas having a molecular structure different from that of the first gas to the substrate, wherein the etching species is generated by performing at least one selected from the group of causing the second gas to react with the first modified layer and activating the first modified layer with the second gas.

2. The method of claim 1, wherein in (a), the first modified layer is formed by causing at least a portion of molecules of the first gas to be physically adsorbed or chemically adsorbed on the at least a portion of the surface of the first film.

3. The method of claim 1, wherein in (a), the first modified layer is formed by generating a compound by a chemical reaction between at least a portion of molecules of the first gas and atoms or molecules of the at least a portion of the surface of the first film.

4. The method of claim 1, wherein in (b), the second gas is supplied to the substrate under a condition that the reaction between the second gas and the first modified layer is more predominant than a reaction between the second gas and the first film.

5. The method of claim 1, wherein in (b), the second gas is supplied to the substrate under a condition that the reaction between the second gas and the first modified layer progresses and a reaction between the second gas and the first film does not progress.

6. The method of claim 1, wherein in (b), the second gas is supplied to the substrate under a condition that the activation of the first modified layer with the second gas is more predominant than an activation of the first film with the second gas.

7. The method of claim 1, wherein in (b), the second gas is supplied to the substrate under a condition that the activation of the first modified layer with the second gas progresses and an activation of the first film with the second gas does not progress.

8. The method of claim 1, wherein in (b), the second gas is supplied to the substrate under a condition that the etching of the at least a portion of the first film with the etching species is more predominant than a reaction between the second gas and the first film.

9. The method of claim 1, wherein in (b), the second gas is supplied to the substrate under a condition that the etching of the at least a portion of the first film with the etching species progresses and a reaction between the second gas and the first film does not progress.

10. The method of claim 1, wherein the cycle includes a first cycle and at least one subsequent cycle, and
wherein in (a) in the at least one subsequent cycle, the second modified layer is removed by causing the first gas to react with the second modified layer by supplying the first gas to the substrate, and the first modified layer is formed in at least a portion of the surface of the first film from which the second modified layer is removed.

11. The method of claim 1, wherein the first film includes a nitrogen-containing film, a transition metal film, or a semiconductor film.

12. The method of claim 1, wherein a second film is further exposed on the surface of the substrate, and
wherein the first film is selectively etched with respect to the second film by performing the cycle a predetermined number of times.

13. The method of claim 12, wherein the first film includes a nitrogen-containing film, a transition metal film, or a semiconductor film, and the second film includes an oxygen-containing film or a non-transition metal film.

14. The method of claim 13, wherein the nitrogen-containing film includes a silicon-based nitrogen-containing film, a boron-based nitrogen-containing film, or a metal-based nitrogen-containing film.

15. The method of claim 13, wherein the oxygen-containing film includes a silicon-based oxygen-containing film or a metal-based oxygen-containing film.

16. The method of claim 12, wherein the first film is etched with respect to the second film with a selectivity of 5:1 or more by performing the cycle the predetermined number of times.

17. The method of claim 1, wherein the first gas includes one or more selected from the group of a silicon-containing gas, a metal-containing gas, an oxygen-containing gas, a nitrogen- and hydrogen-containing gas, a boron-containing gas, a phosphorus-containing gas, and a halogen-containing gas, and
wherein the second gas includes one or more selected from the group of the halogen-containing gas and an acetylacetone-based gas.

18. The method of claim 1, wherein the cycle is performed under a non-plasma atmosphere.

19. The method of claim 1, wherein the cycle is performed under a condition that an etching reaction of the first film is difficult to continue when at least one selected from the group of the first gas and the second gas is present alone.

20. A method of manufacturing a semiconductor device, comprising:
etching a first film exposed on a surface of a substrate by performing a cycle two or more times, the cycle including non-simultaneously performing:
(a) forming a first modified layer in at least a portion of a surface of the first film by supplying a first gas to the substrate; and
(b) etching at least a portion of the first film with an etching species and forming a second modified layer, which is removable by the first gas, in at least a portion of the surface of the first film having at least the portion etched, by supplying a second gas having a molecular structure different from that of the first gas to the substrate, wherein the etching species is generated by performing at least one selected from the group of causing the second gas to react with the first modified layer and activating the first modified layer with the second gas.

* * * * *